(12) United States Patent
Siemieniec et al.

(10) Patent No.: US 9,590,095 B2
(45) Date of Patent: Mar. 7, 2017

(54) SEMICONDUCTOR DEVICE WITH FIELD ELECTRODE STRUCTURES IN A CELL AREA AND TERMINATION STRUCTURES IN AN EDGE AREA

(71) Applicant: Infineon Technologies Austria AG, Villach (AT)

(72) Inventors: Ralf Siemieniec, Villach (AT); Oliver Blank, Villach (AT); Franz Hirler, Isen (DE); Michael Hutzler, Villach (AT); Martin Poelzl, Osslach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/829,526

(22) Filed: Aug. 18, 2015

(65) Prior Publication Data
US 2016/0064547 A1    Mar. 3, 2016

(30) Foreign Application Priority Data

Aug. 28, 2014  (DE) .......................... 10 2014 112 371

(51) Int. Cl.
*H01L 29/76* (2006.01)
*H01L 29/94* (2006.01)
(Continued)

(52) U.S. Cl.
CPC ...... *H01L 29/7811* (2013.01); *H01L 29/0619* (2013.01); *H01L 29/0623* (2013.01); *H01L 29/0649* (2013.01); *H01L 29/0696* (2013.01); *H01L 29/404* (2013.01); *H01L 29/407* (2013.01); *H01L 29/7813* (2013.01); *H01L 29/0638* (2013.01); *H01L 29/41766* (2013.01)

(58) Field of Classification Search
CPC ............ H01L 29/7802; H01L 29/7811; H01L 29/0696
USPC ....................................................... 257/329
See application file for complete search history.

(56) References Cited

U.S. PATENT DOCUMENTS

| | | | |
|---|---|---|---|
| 2008/0087951 A1* | 4/2008 | Takaya | H01L 29/0623 257/334 |
| 2010/0207198 A1* | 8/2010 | Blanchard | H01L 29/0634 257/328 |

(Continued)

FOREIGN PATENT DOCUMENTS

| | | |
|---|---|---|
| DE | 102005028224 A1 | 12/2006 |
| DE | 102013106795 A1 | 1/2014 |

(Continued)

*Primary Examiner* — Theresa T Doan
(74) *Attorney, Agent, or Firm* — Murphy, Bilak & Homiller, PLLC

(57) ABSTRACT

A semiconductor device includes field electrode structures regularly arranged in lines in a cell area and forming a first portion of a regular pattern. Termination structures are formed in an inner edge area surrounding the cell area, wherein at least portions of the termination structures form a second portion of the regular pattern. Cell mesas separate neighboring ones of the field electrode structures from each other in the cell area and include first portions of a drift zone, wherein a voltage applied to a gate electrode controls a current flow through the cell mesas. At least one doped region forms a homojunction with the drift zone in the inner edge area.

17 Claims, 21 Drawing Sheets

(51) Int. Cl.
*H01L 29/78* (2006.01)
*H01L 29/06* (2006.01)
*H01L 29/40* (2006.01)
*H01L 29/417* (2006.01)

(56) References Cited

U.S. PATENT DOCUMENTS

2012/0049187 A1    3/2012  Haruyama
2012/0217540 A1    8/2012  Hirler
2015/0076594 A1*   3/2015  Hsieh ............... H01L 29/0619
                                                    257/334

FOREIGN PATENT DOCUMENTS

DE    102014101164 A1    7/2014
KR    20110096151  A     8/2011
WO    WO00/14807   A1    3/2000

* cited by examiner

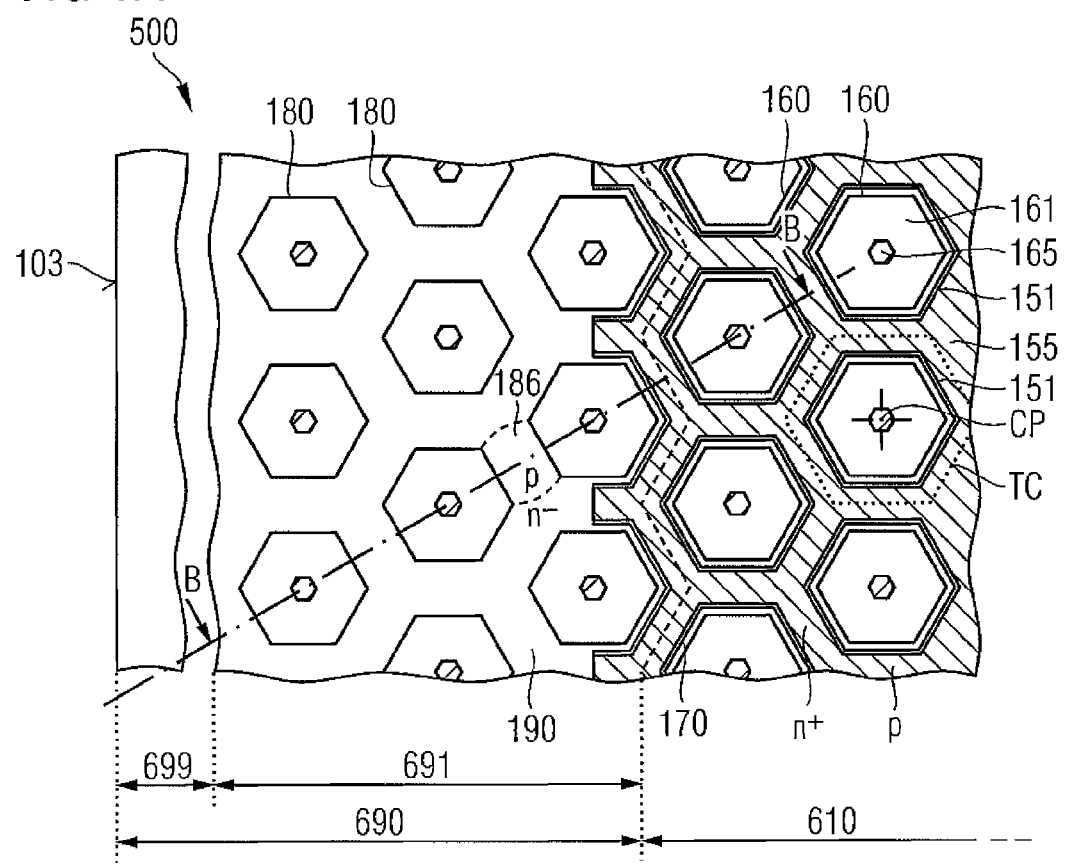
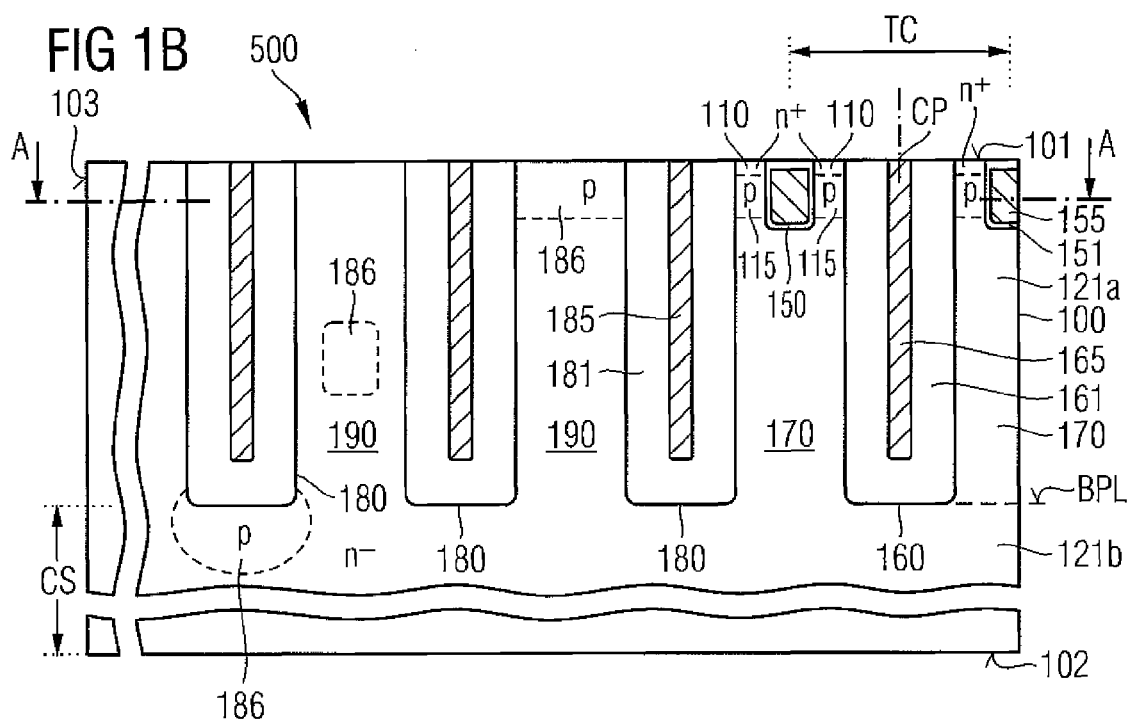

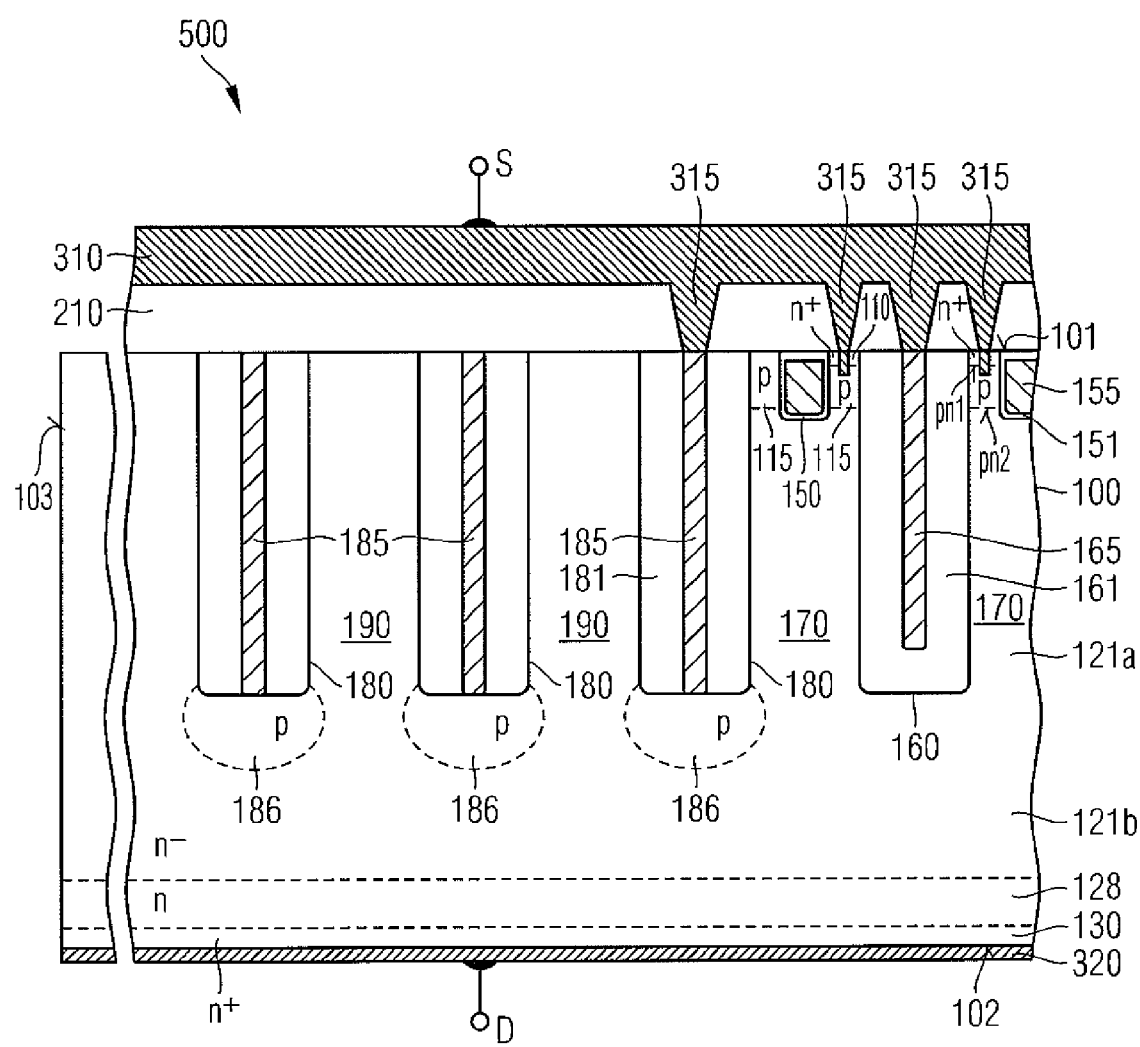

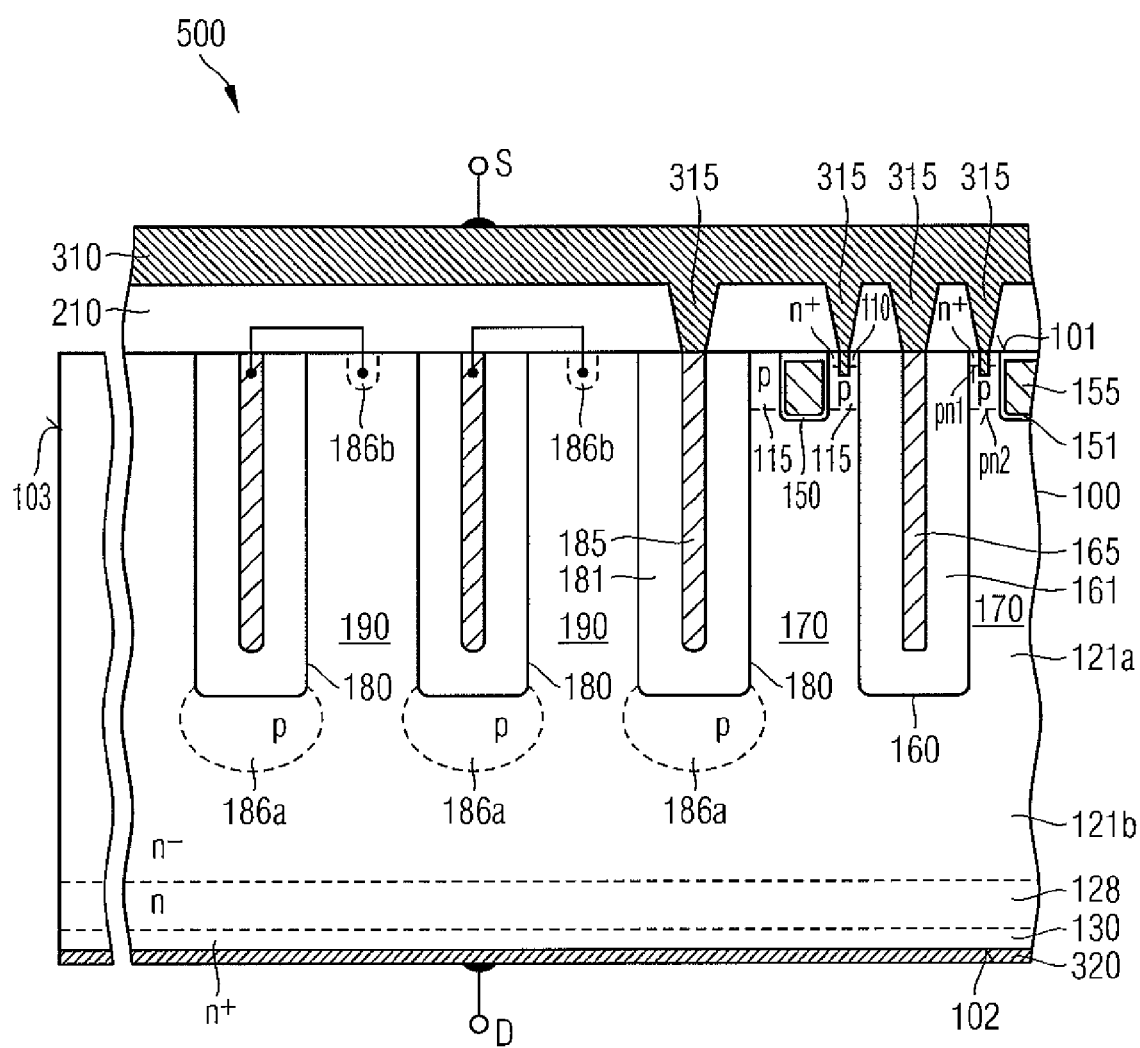

SEMICONDUCTOR DEVICE WITH FIELD ELECTRODE STRUCTURES IN A CELL AREA AND TERMINATION STRUCTURES IN AN EDGE AREA

BACKGROUND

The present application claims priority under 35 USC §119 to German (DE) Patent Application Serial No. DE 10 2014 112 371.9 filed on Aug. 28, 2014. The disclosure in this priority application is hereby incorporated fully by reference into the present application.

BACKGROUND ART

Power semiconductor devices based on IGFET (insulated gate field effect transistor) cells are typically vertical devices with a load current flow between a first surface at a front side of a semiconductor die and a second surface at a rear side. In a blocking mode, stripe-shaped compensation structures extending from the front side into the semiconductor die deplete semiconductor mesas formed between the stripe-shaped compensation structures. The compensation structures allow higher dopant concentrations in the semiconductor mesas without adverse impact on the blocking capability. Higher dopant concentrations in turn reduce the on state resistance of the device. During fabrication, deep compensation structures filled with thick field dielectrics may cause wafer bowing. For tolerable wafer bowing compensation structures may be too shallow for IGFETs specified for high breakdown voltage.

It is desirable to provide semiconductor devices with low ohmic losses and high breakdown voltage.

SUMMARY

According to an embodiment a semiconductor device includes field electrode structures regularly arranged in a cell area and forming a first portion of a regular pattern. Termination structures are formed in an inner edge area surrounding the cell area, wherein at least portions of the termination structures form a second portion of the regular pattern. Cell mesas separate neighboring ones of the field electrode structures from each other in the cell area and include first portions of a drift zone, wherein a voltage applied to a gate electrode controls a current flow through the cell mesas. At least one doped region forms a homojunction with the drift zone in the inner edge area.

According to another embodiment a semiconductor device includes field electrode structures regularly arranged in a cell area and forming a first regular pattern. Termination structures including termination electrodes are formed in an inner edge area surrounding the cell area and form a second regular pattern congruent with a portion of the first regular pattern. Cell mesas separate neighboring ones of the field electrode structures from each other in the cell area and include first portions of a drift zone, wherein a voltage applied to a gate electrode controls a current flow through the cell mesas. Doped regions directly adjoin the termination structures and form pn junctions with the drift zone in the inner edge area.

According to a further embodiment an electronic assembly includes a semiconductor device including field electrode structures regularly arranged in a cell area and forming a first portion of a regular pattern. Termination structures are formed in an inner edge area surrounding the cell area, wherein at least portions of the termination structures form a second portion of the regular pattern. Cell mesas separate neighboring ones of the field electrode structures from each other in the cell area and include first portions of a drift zone, wherein a voltage applied to a gate electrode controls a current flow through the cell mesas. At least one doped region forms a homojunction with the drift zone in the inner edge area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic horizontal cross-sectional view of a portion of a semiconductor device according to an embodiment related to termination structures and field electrode structures complementing each other in a regular pattern.

FIG. 1B is a schematic vertical cross-sectional view of the semiconductor device portion of FIG. 1A along line B-B.

FIG. 5C is a schematic vertical cross-sectional view of a portion of a semiconductor device according to an embodiment with buried doped regions electrically connected to floating termination electrodes.

FIG. 5D is a schematic vertical cross-sectional view of a portion of a semiconductor device according to a further embodiment concerning near-surface doped regions electrically connected to neighboring termination electrodes.

DETAILED DESCRIPTION

Figure 2A:
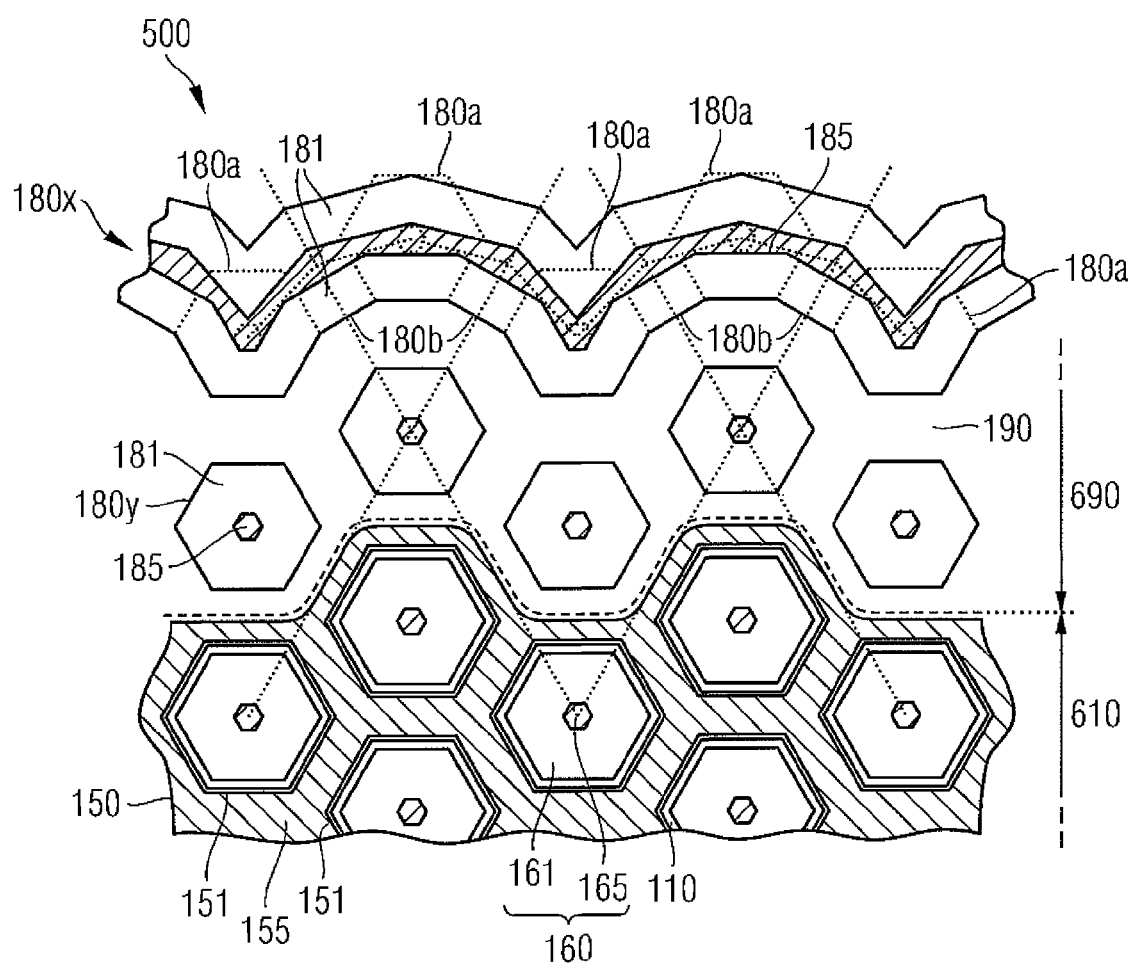
FIG. 2A is a schematic horizontal cross-sectional view of a portion of a semiconductor device according to an embodiment concerning a circumferential termination structure with portions of the termination structure and field electrode structures complementing each other in a regular pattern.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "if" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1B refer to a semiconductor device 500 including a plurality of identical IGFET (insulated gate field effect transistor) cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT.

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

At a front side the semiconductor body 100 has a first surface 101 which may be approximately planar or which may be defined by a plane spanned by coplanar surface sections. A planar second surface 102 extends parallel to the first surface 101 at an opposite rear side. A distance between the first and second surfaces 101, 102 is a function of the voltage blocking capability and may be at least 20 μm. According to other embodiments, the distance may be in the range of up to, e.g., 250 μm. A lateral surface 103, which is tilted to the first and second surfaces 101, 102 connects the first and second surfaces 101, 102.

In a plane parallel to the first surface 101 the semiconductor body 100 may have a rectangular shape with an edge length of several millimeters. A normal to the first surface 101 defines a vertical direction and directions orthogonal to the vertical direction are horizontal directions.

The transistor cells TC are formed in a cell area 610, wherein each transistor cell TC includes a field electrode structure 160 extending from the first surface 101 into the semiconductor body 100 down to a bottom plane BPL. Each field electrode structure 160 includes a conductive spicular or needle-shaped field electrode 165 and a field dielectric 161 surrounding the field electrode 165.

The field electrode 165 includes or consists of a doped polycrystalline silicon layer and/or a metal-containing layer. The field dielectric 161 separates the field electrode 165 from the surrounding semiconductor material of the semiconductor body 100 and may include or consist of a thermally grown silicon oxide layer. According to an embodiment, the field dielectric 161 may include or consist of a deposited silicon oxide layer, e.g., a silicon oxide layer based on TEOS (tetraethyl orthosilicate).

A vertical extension of the field electrode structures 160 is smaller than a distance between the first surface 101 and the second surface 102 such that a contiguous section CS of the semiconductor body 100 is formed between the field electrode structures 160 and the second surface 102. The contiguous section CS includes a second portion 121$b$ of a drift zone 121 of a first conductivity type. The vertical extension of the field electrode structures 160 may be in a range from 0.2 µm to 45 µm, for example in a range from 2 µm to 20 µm.

A first horizontal extension of the field electrode 165 may be at most three times or at most twice as large as a second horizontal extension orthogonal to the first horizontal extension. The horizontal extensions may be in a range from 0.1 µm to 2 µm, for example in a range from 0.15 µm to 1 µm.

The horizontal cross-sections of the field electrodes 165 and the field electrode structures 160 may be ellipses, ovals, rectangles, or regular or distorted polygons, with or without rounded and/or chamfered corners, respectively. According to an embodiment, the first and second horizontal extensions are approximately equal and the horizontal cross-sectionals of the field electrodes 165 and the field electrode structures 160 are circles or regular polygons such as octagons, hexagons or squares, with or without rounded or chamfered corners, respectively.

The field electrode structures 160, which are centered on a horizontal center point CP of the respective transistor cell TC, are regularly arranged, for example equally spaced. According to an embodiment, equally spaced field electrode structures 160 are arranged matrix-like in lines and rows in the cell area 610. According to other embodiments, the field electrode structures 160 may be arranged in shifted lines, wherein odd lines are shifted with respect to even lines by half the distance between two neighboring field electrode structures 160 in the same line. Semiconducting portions of the transistor cells TC are formed in cell mesas 170 of the semiconductor body 100, wherein the cell mesas 170 protrude from a contiguous section CS of the semiconductor body 100, surround the field electrode structures 160 and form a grid with the field electrode structures 160 arranged in the meshes.

The cell mesas 170 include first portions 121$a$ of a drift zone 121 of the first conductivity type, wherein the first portions 121$a$ directly adjoin the second portion 121$b$ formed in the contiguous section CS of the semiconductor body 100. A dopant concentration in the second portion 121$b$ of the drift zone 121 may be equal to a dopant concentration in the first portion 121$a$ of the drift zone 121. A mean dopant concentration in a drift zone 121 including the first and second portions 121$a$, 121$b$ may be between $1E15$ cm$^{-3}$ and $1E17$ cm$^{-3}$, for example in a range from $5E15$ cm$^{-3}$ to $5E16$ cm$^{-3}$.

Each cell mesa 170 further includes a body zone 115 of a second conductivity type opposite to the first conductivity type and one or more source zones 110 of the first conductivity type. The body zone 115 separates the source zone(s) 110 from the first portion 121$a$ of the drift zone 121 in the respective cell mesa 170. A gate structure 150 extends from the first surface 101 into the cell mesas 170. The gate structure 150 includes a gate electrode 155 capacitively coupled to the body zones 115 through a gate dielectric 151.

Outer edges of the outermost field electrode structures 160 define the contour of the cell area 610. An edge area 690 surrounds the cell area 610. The edge area 690 may directly adjoin the lateral surface 103. According to other embodiments, the edge area 690 may directly adjoin a logic portion including logic circuits based, e.g. on lateral transistors. An inner edge area 691 of the edge area 690 directly adjoins to and surrounds the cell area 610 and includes termination structures 180.

The termination structures 180 may consist of at least one of insulating and intrinsic semiconducting materials. According to the illustrated embodiment, at least some of or all termination structures 180 include a termination electrode 185 and a termination dielectric 181 surrounding the termination electrode 185, respectively.

The termination electrode 185 includes or consists of a doped polycrystalline silicon layer and/or a metal-containing layer. The termination dielectric 181 separates the termination electrode 185 from the surrounding semiconductor material of the semiconductor body 100 and may include or consist of a thermally grown silicon oxide layer. According to an embodiment, the termination dielectric 181 may include or consist of a deposited silicon oxide layer, e.g. a silicon oxide based on TEOS.

The termination and field dielectrics 181, 161 may have the same thickness and the same configuration, e.g., the same layer structure. For example, if both termination and field dielectrics 181, 161 consist of thermally grown semiconductor oxide, e.g. silicon oxide, the thickness of the field dielectrics 161 may be equal to the thickness of the termination dielectrics 181. If the termination and field dielectrics 181, 161 include a deposited oxide layer, the thickness of the deposited oxide layer may be the same in the field and the termination dielectrics 161, 181.

The vertical extension of the termination structures 180 is equal to or greater than the vertical extension of the field electrode structures 160. A width of the termination structures 180 may be equal to or greater than a horizontal dimension of the field electrode structures 160. Termination structures 180 and field electrode structures 160 may have the same horizontal cross-sectional shape and cross-sectional area and may be formed contemporaneously in the same photolithography process.

Center points CP of the termination structures 180 and the field electrodes structures 160 may be equally spaced such that the termination structures 180 and the field electrode structures 160 complement each other in a regular pattern, wherein center-to-center distances between neighboring termination structures 180, between neighboring termination and field electrode structures 180, 160 and between neighboring field electrode structures 160 are equal. The arrangement of the center points of the termination electrode structures 180 is congruent to the arrangement of the center points of a portion of the field electrode structures. In other words, the field electrode structures 160 form a first portion of a regular pattern and the termination structures 180 form a second portion of the same regular pattern.

An outer edge area 699 of the edge area 690 is devoid of termination structures 180. The inner edge area 691 may include, in the same edge mesa 190 at most two of gate structures 150, body zones 115 and source zones 110 such that the edge area 690 does not include functional transistor cells TC. Termination mesas 190 including first portions 121$a$ of the drift zone 121 separate neighboring termination structures 180. The termination mesas 190 may have the same width as the cell mesas 170. The termination mesas 190 protrude from the contiguous section CS of the semiconductor body 100, surround the termination structures 180 and form a grid complementing the grid formed by the cell mesas 170.

One or more doped regions 186 forming homojunctions with the drift zone 121 are formed in the inner edge area 691 of the edge area 690 between the cell area 610 and the outermost termination structure 180.

Some or all of the doped regions 186 may be formed in the vertical projection of the termination structures 180 between the termination structures 180 and the second surface 102. According to other embodiments some or all of the doped regions 186 may be formed between neighboring termination structures 180 or between neighboring termination and field electrode structures 180, 160 in the inner edge area 691, wherein the buried doped regions 186 may form unipolar homojunctions or pn junctions with the drift zone 121. According to a further embodiment, some or all of the doped regions 186 may be near-surface doped regions close to or directly adjoining the first surface 101 in the termination mesas 190. The doped regions 186 may be depletable at operation conditions within the absolute maximum ratings the semiconductor device 500 is specified for and increase the blocking capability of the semiconductor device 500.

The termination structures 180 increase the blocking capability of the edge area 690. By extending the geometry of the cell area 610 uniform dopant concentrations in corresponding mesas can be achieved even if, e.g., segregation of dopants occurs during thermal oxide growth for forming portions of the field or termination dielectrics 161, 181 thereby simplifying the manufacturing of the semiconductor device 500.

The termination structures 180 may exclusively include spicular or needle-shaped termination structures arranged in two or more rings around the cell area 610, one, two or more circumferential termination structures 180 or a combination of spicular and circumferential termination structures.

Figure 2B:
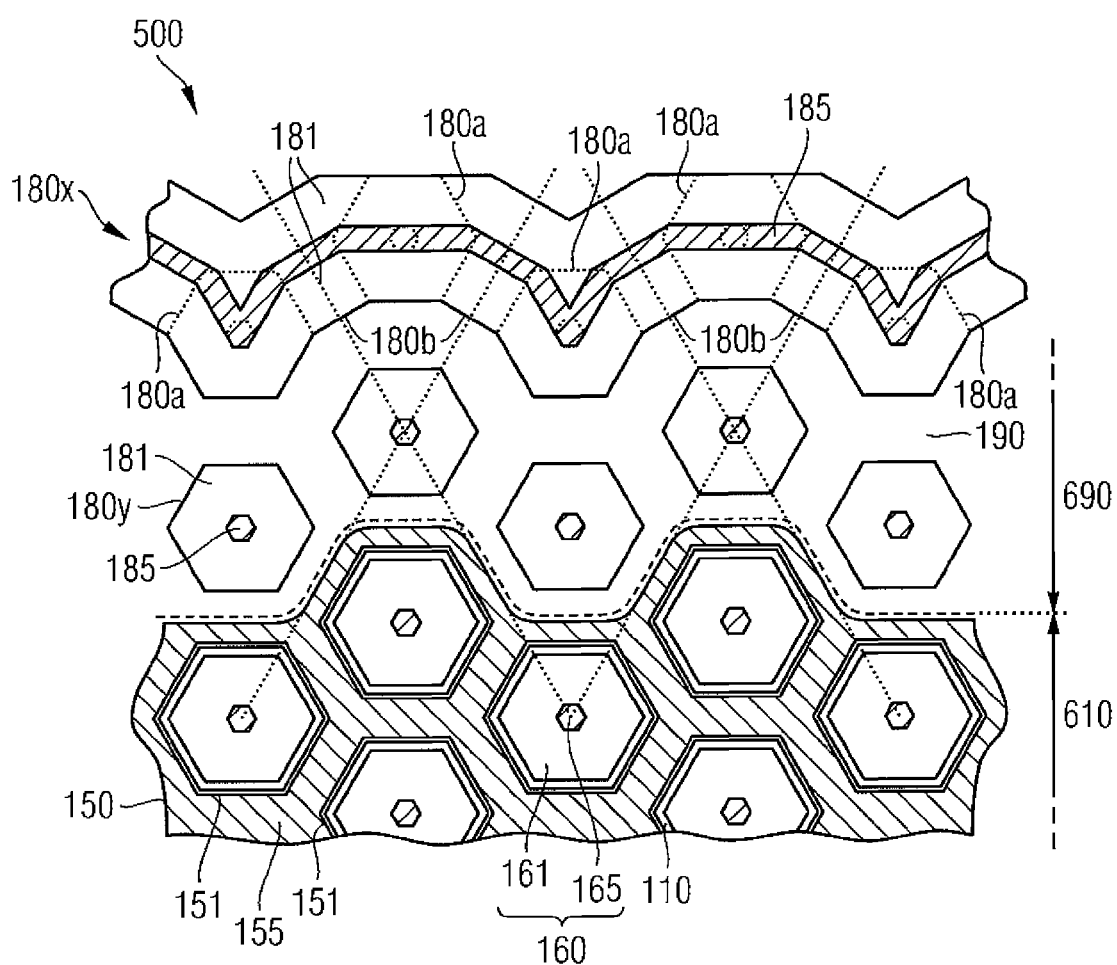
FIG. 2B is a schematic horizontal cross-sectional view of a portion of a semiconductor device according to a further embodiment concerning a circumferential termination structure with portions of the termination structure and field electrode structures complementing each other in a regular pattern.
Figure 2C:
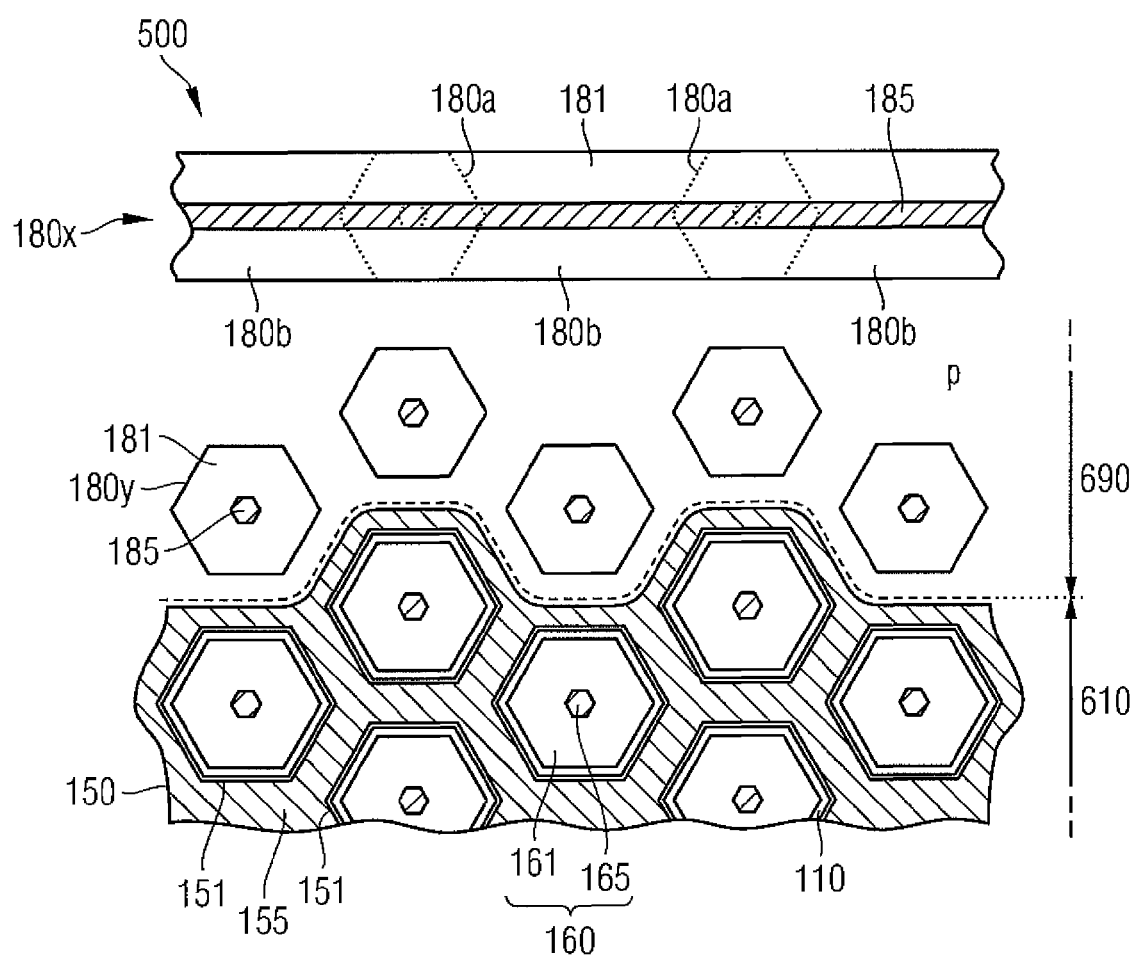
FIG. 2C is a schematic horizontal cross-sectional view of a portion of a semiconductor device according to an embodiment concerning a circumferential termination structure with smooth outlines.

FIGS. 2A to 2C refer to semiconductor devices 500 with first termination structures 180x including first portions 180a that complement with field electrode structures 160 and, if applicable, second, spicular termination structures 180y in a regular pattern as well as second portions 180b connecting neighboring first portions 180a.

In FIG. 2A the field electrode structures 160 are arranged in shifted lines, wherein odd lines are shifted with respect to even lines by half the center-to-center distance of the field electrodes 160 along the line direction. The edge area 690 includes needle-shaped first termination structures 180c complementing the pattern of the field electrode structures 160. At least one first termination structure 180x includes first portions 180a complementing with the field electrode structures 160 and spicular second termination structures 180y in a regular pattern. Second portions 180b of the first termination structure 180x are formed between neighboring first portions 180a, wherein a distance of the second portions 180b to neighboring needle-shaped first termination structures 180a is equal to a minimum distance between the first portions 180a and the concerned first termination structures 180.

The termination electrodes 185 assigned to the first and second portions 180a, 180b of the same first termination structure 180x are connected to each other, wherein a width of the combined termination electrode 185 of the second termination structure 180x may vary. The circumferential first termination structure 180x surrounds the cell area 610. Between the circumferential first trench structure 180x and the cell area 610 the needle-shaped second termination structures 180 form one or more staggered rings. The thickness of the field dielectric 181 of the first termination structure 180x is uniform and the same as that of the field dielectrics 181 of the second termination structures 180y.

In FIG. 2B the combined termination electrode 185 in the circumferential first termination structure 180x has the same width in both the first and second portions 180a, 180b.

In both embodiments of FIGS. 2A and 2B an outermost termination mesa 190 between the first circumferential termination structure 180x and the outermost ring of needle-shaped second termination structures 180y has approximately uniform width. In combination with a higher blocking capability in the edge area 690 than in the cell area 610, the uniform width of the outermost termination mesa 190 may contribute to improved avalanche ruggedness.

FIG. 2C refers to a circumferential first trench structure 180x with first portions 180a complementing with needle-shaped second termination structures 180 and field electrode structures 160 in a regular pattern and second portions 180b directly connecting neighboring first portions 180a. The circumferential first termination structure 180x includes straight sections at least twice as long as a center-to-center distance between neighboring field electrode structures 160 and surrounds the cell area 610 and two or more rings of the needle-shaped termination structures 180y.

Figure 2D:
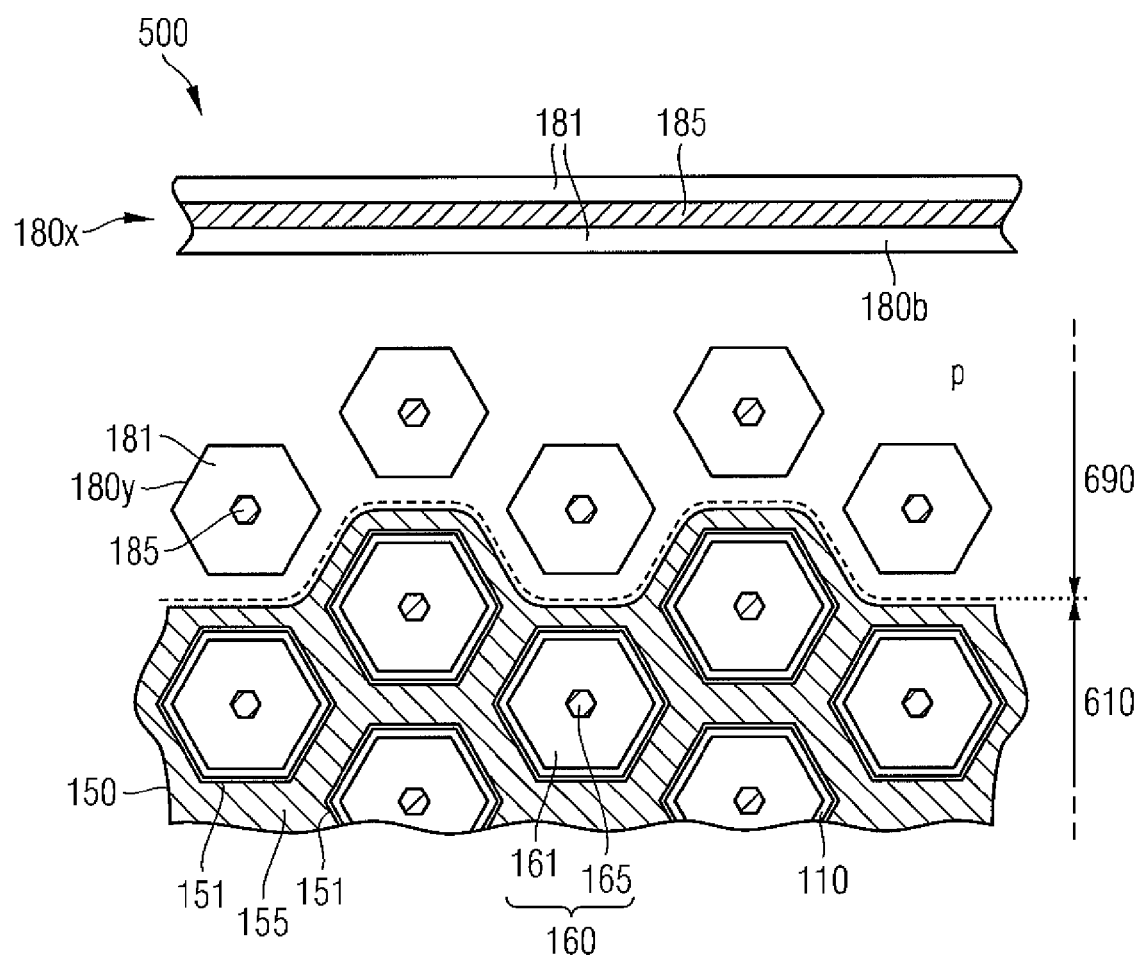
FIG. 2D is a schematic horizontal cross-sectional view of a portion of a semiconductor device according to an embodiment concerning a circumferential termination structure narrower than the field electrode structures.

In FIG. 2D a circumferential termination structure 180x is narrower than the field electrode structures 160.

Figure 2E:
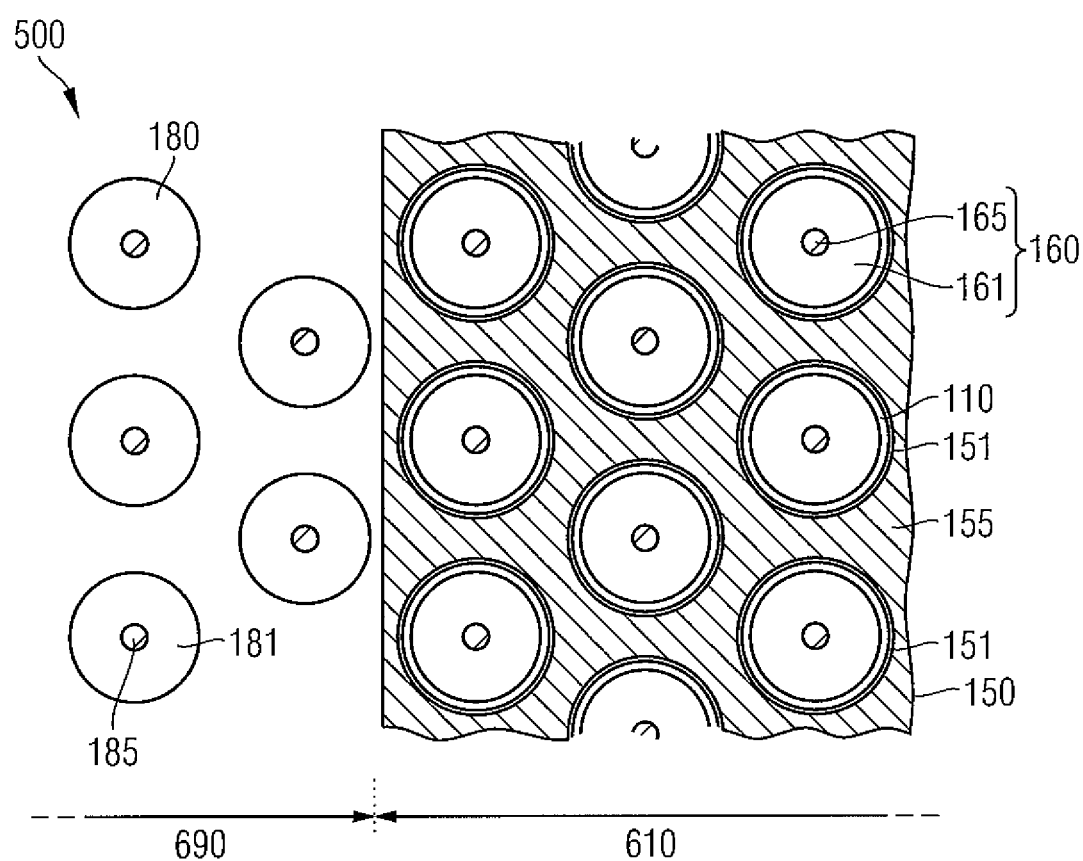
FIG. 2E is a schematic horizontal cross-sectional view of a portion of a semiconductor device according to an embodiment related to needle-shaped termination and field electrode structures with circular cross-sectionals.

In FIG. 2E the horizontal cross-sections of the field electrode structures 160 and termination structures 180 are circles. Two rings of needle-shaped termination structures 180 surround the cell area 610.

Figure 2F:
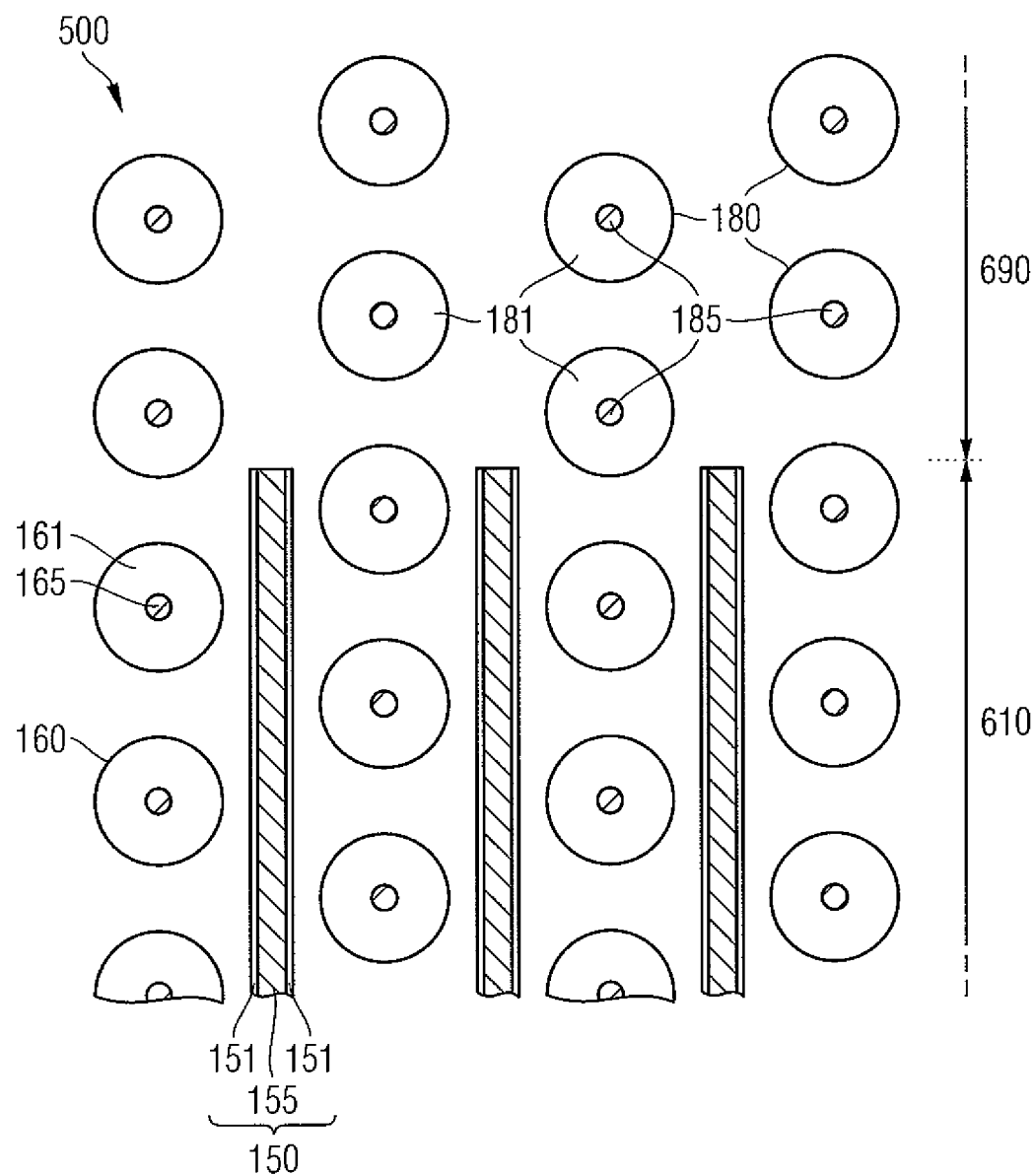
FIG. 2F is a schematic horizontal cross-sectional view of a semiconductor device according to an embodiment related to needle-shaped termination and field electrode structures and stripe-shaped gate structures.

FIG. 2F refers to an embodiment with the field and termination structures 160, 180 arranged in lines and stripe-shaped gate structures 150 between neighboring lines of field electrodes 160. Layouts with stripe-shaped gate structures 150 of FIG. 2F may also be combined with circumferential termination structures 180x as illustrated in FIGS. 2A to 2D, by way of example.

Figure 3A:
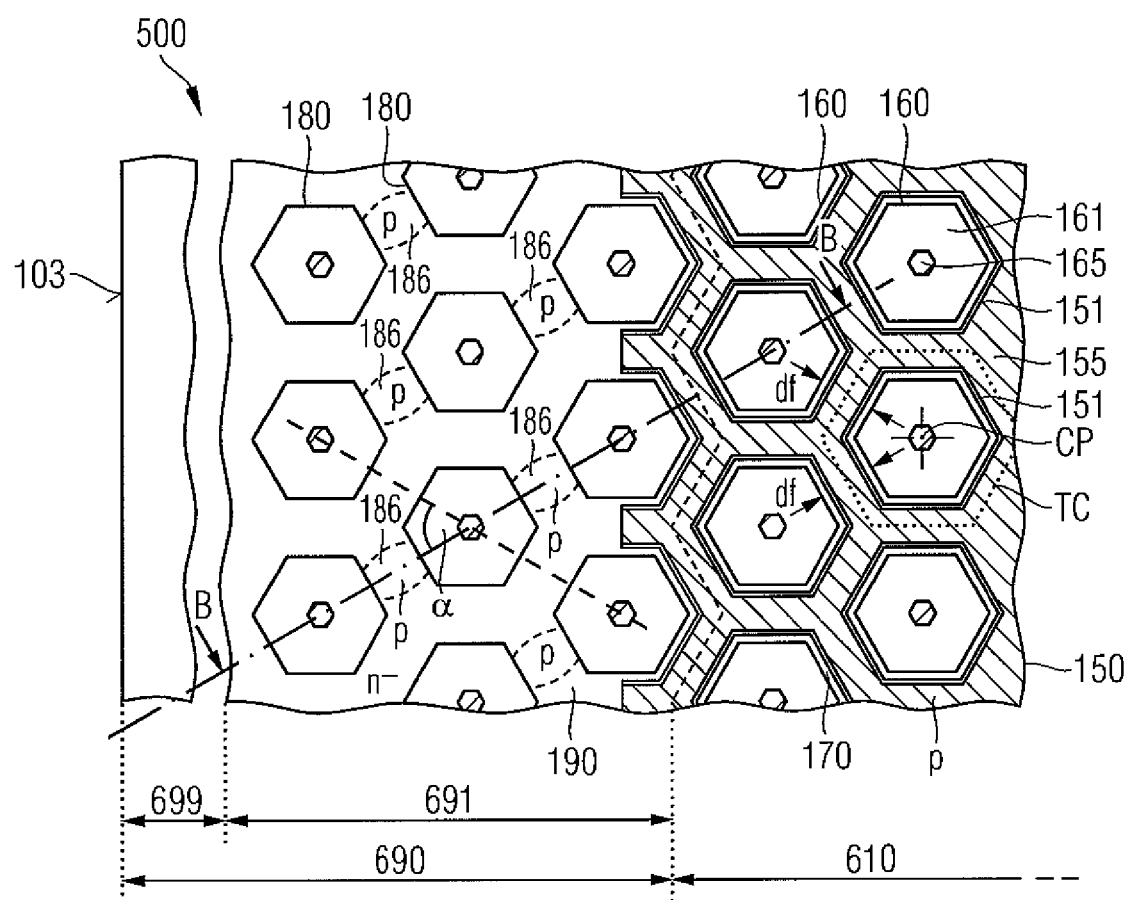
FIG. 3A is a schematic horizontal cross-sectional view of a portion of a semiconductor device according to an embodiment concerning dot-shaped near-surface doped regions electrically connected with termination electrodes.
Figure 3B:
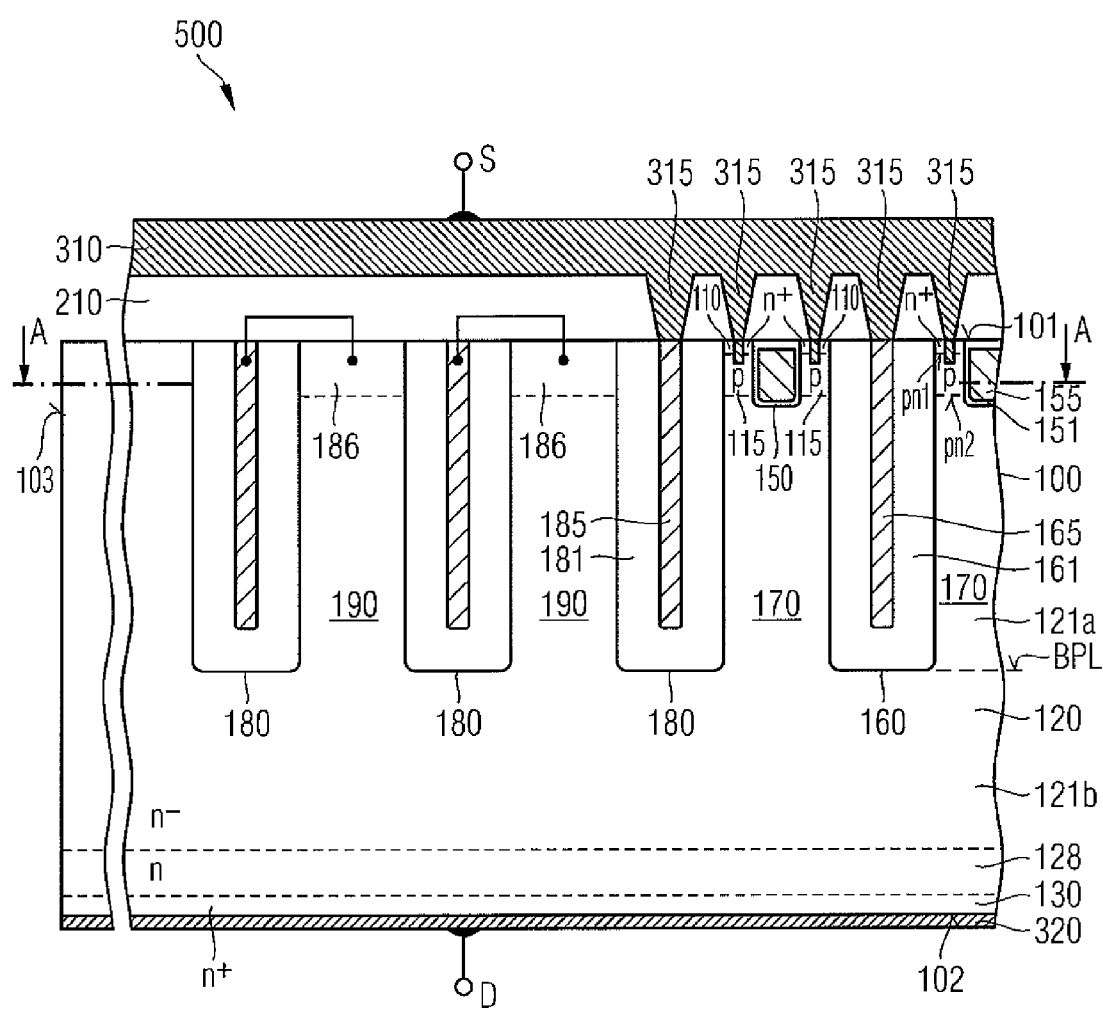
FIG. 3B is a schematic vertical cross-sectional view of the semiconductor device portion of FIG. 3A along line B-B.

FIGS. 3A to 3B refer to a semiconductor device 500 with near-surface doped regions 186 electrically connected to termination electrodes 185.

A semiconductor body 100 as described in detail with reference to FIGS. 1A and 1B includes a drift and rear side structure 120 of the first conductivity type as well as a contact portion 130, which may have the first or the second conductivity type, between the drift and rear side structure 120 and the second surface 102. The drift and rear side structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between $1E15$ cm$^{-3}$ and $1E17$ cm$^{-3}$, for example in a range from $5E15$ cm$^{-3}$ to $5E16$ cm$^{-3}$. The drift and rear side structure 120 may include further doped zones, for example a field stop layer 128 that separates the drift zone 121 from the contact portion 130. A mean dopant concentration in the field stop layer 128 may be at least five times as high as a mean dopant concentration in the drift zone 121 and at most one-fifth of a maximum dopant concentration in the contact portion 130.

The contact portion 130 may be a heavily doped base substrate or a heavily doped layer. Along the second surface 102 a dopant concentration in the contact portion 130 is sufficiently high to form an ohmic contact with a metal directly adjoining the second surface 102. In case the semiconductor body 100 is based on silicon, in an n-conductive contact portion 130 the dopant concentration along the second surface 102 may be at least $1E18$ cm$^{-3}$, for example at least $5E19$ cm$^{-3}$, whereas in a p-conductive contact portion 130 the dopant concentration may be at least 1E18 cm$^{-3}$, for example at least 5E18 cm$^{-3}$.

In a cell area 610, field electrode structures 160 extending from a front side down to a bottom plane BPL are regularly arranged at equal distances in lines and columns. According to the illustrated embodiment, the field electrode structures 160 are arranged matrix-like in lines and columns intersecting the lines at an angle α of 60°. Along the lines and rows, the field electrode structures 160 are spaced at a distance df. As regards further details of the field electrode structures 160 reference is made to the detailed description in FIGS. 1A and 1B.

Transistor cells TC are centered on horizontal center points CP of the field electrode structures 160. Semiconducting portions of the transistor cells TC are formed in cell mesas 170 between the field electrode structures 160. The cell mesas 170 include first portions 121a of the drift zone 121 directly adjoining a second portion 121b of the drift zone 121 in a contiguous portion CS of the semiconductor body 100 between the bottom plane BPL and the second surface 102.

Each cell mesa 170 includes one or more source zones 110 and a body zone 115 forming first pn junctions pn1 with the source zones 110 and a second pn junction pn2 with the drift zone 121.

The source zones 110 may be wells extending from the first surface 101 into the semiconductor body 100, for example into the body zones 115. According to an embodiment, one source zone 110 surrounds the field electrode structure 160 of the respective transistor cell TC in a horizontal plane. The source zone(s) 110 may directly adjoin the respective field electrode structure 160 or may be spaced from the field electrode structure 160. According to other embodiments, the field electrode structure 160 of the concerned transistor cell TC is not completely surrounded by one source zone 110 or includes several spatially separated source zones 110, which may be arranged rotational symmetric with respect to the center point CP.

The cell area 610 further includes a gate structure 150 with a conductive gate electrode 155 surrounding transistor sections of the transistor cells TC in a horizontal plane, wherein the transistor sections are portions of the cell mesas 170 including the source and body zones 110, 115. According to the illustrated embodiment, the gate structure 150 is spaced from the field electrode structures 160. The gate electrode 155 includes or consists of a heavily doped polycrystalline silicon layer and/or a metal-containing layer.

The gate electrode 155 is completely insulated against the semiconductor body 100, wherein a gate dielectric 151 separates the gate electrode 155 at least from the body zone 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The gate structure 150 may be a lateral gate formed outside the semiconductor body 100 along the first surface 101. According to the illustrated embodiment the gate structure 150 is a trench gate extending from the first surface 101 into the semiconductor body 100, wherein a vertical extension of the gate structure 150 is smaller than the vertical extension of the field electrode structures 160. According to an embodiment, the vertical extension of the gate structure 150 may be in a range from 200 nm to 2000 nm, for example in a range from 600 nm to 1000 nm.

In the illustrated embodiments and for the following description, the first conductivity type is n-type and the second conductivity type is p-type. Similar considerations as outlined below apply also to embodiments with the first conductivity type being p-type and the second conductivity type being n-type.

When a voltage applied to the gate electrode 150 exceeds a preset threshold voltage, electrons accumulate in channel portions directly adjoining the gate dielectric 151 and form inversion channels short-circuiting the second pn junction pn2 for electrons.

According to the illustrated embodiment the gate structure 150 forms a grid which meshes surround the field electrode structures 160 and portions of the cell mesas 170 including the source and body zones 110, 115. According to other embodiments, the gate structure 150 may directly adjoin to the field electrode structures 160.

Portion of the gate structure 150 may extend into the edge area 690, where the gate structure 150 may include expansions for electrically connecting the gate electrode 155 with a metal gate electrode at the front side and outside the vertical projection of the cell area 610.

An interlayer dielectric 210 adjoining the first surface 101 may electrically insulate the gate electrode 155 from a first load electrode 310 arranged at the front side. In addition, the interlayer dielectric 210 may be formed in the vertical projection of the field electrode structures 160.

The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first load electrode 310 may form or may be electrically coupled or connected to a first load terminal, for example the source terminal S in case the semiconductor device 500 is an IGFET. A second load electrode 320, which directly adjoins the second surface 102 and the contact portion 130, may form or may be electrically connected to a second load terminal, which may be the drain terminal D in case the semiconductor device 500 is an IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

Contact structures 315 extend through openings in the interlayer dielectric 210 and electrically connect the first load electrode 310 with the source and body zones 110, 115 as well as with the field electrodes 165 of the transistor cells TC. The contact structures 315b may include one or more conductive metal containing layers based on, e.g., titanium (Ti) or tantalum (Ta) and a metal fill portion, e.g., based on tungsten (W). According to other embodiments the contact structures 315, 315b include heavily doped semiconductor structures, e.g., heavily n-doped polycrystalline structures or heavily p-doped columnar single crystalline structures.

According to other embodiments the field electrodes 165 may be electrically connected with the gate electrodes 155, to a control terminal of the semiconductor device 500, to an output of an internal driver circuit, or may electrically float. An edge area 690 surrounding the cell area 610 includes termination structures 180 and termination mesas 190 as described in detail with regard to the previous Figures.

The termination mesas 190 include one or more near-surface doped region(s) 186 electrically connected to the termination electrodes 185 of neighboring termination structures 180 averted from the cell area 610 with respect to the concerned near-surface doped region 186. Termination electrodes 185 electrically connected to the same near-surface doped region 186 share the same potential.

According to an embodiment, a plurality of near-surface doped regions 186 are electrically connected to different termination electrodes 185, respectively. For example, the near-surface doped regions 186 may be closer to the cell area 610 than the termination electrodes 185 they are connected to. Connecting the termination electrodes 185 to potentials between the source and the drain potential locally reduces the effective electric field at the respective termination structure 180.

The embodiment of FIG. 3A to 3B can be combined with buried doped regions 186 formed in the vertical projection of at least some of the termination structures 180 between the bottom plane BPL and the second surface 102.

The field electrode structures 160 allow higher dopant concentrations in the drift zone 121 without adversely affecting the blocking capability of the semiconductor device 500. Compared to stripe-shaped field electrodes the needle-shaped field electrodes 165 increase the available cross-sectional area for the drift zone 121 and therefore reduce the on-state resistance RDSon. The near-surface doped regions 186 as well as the buried doped regions 186 between the termination structures 180 and the second surface 102 increase the voltage blocking capability.

Figure 4A:
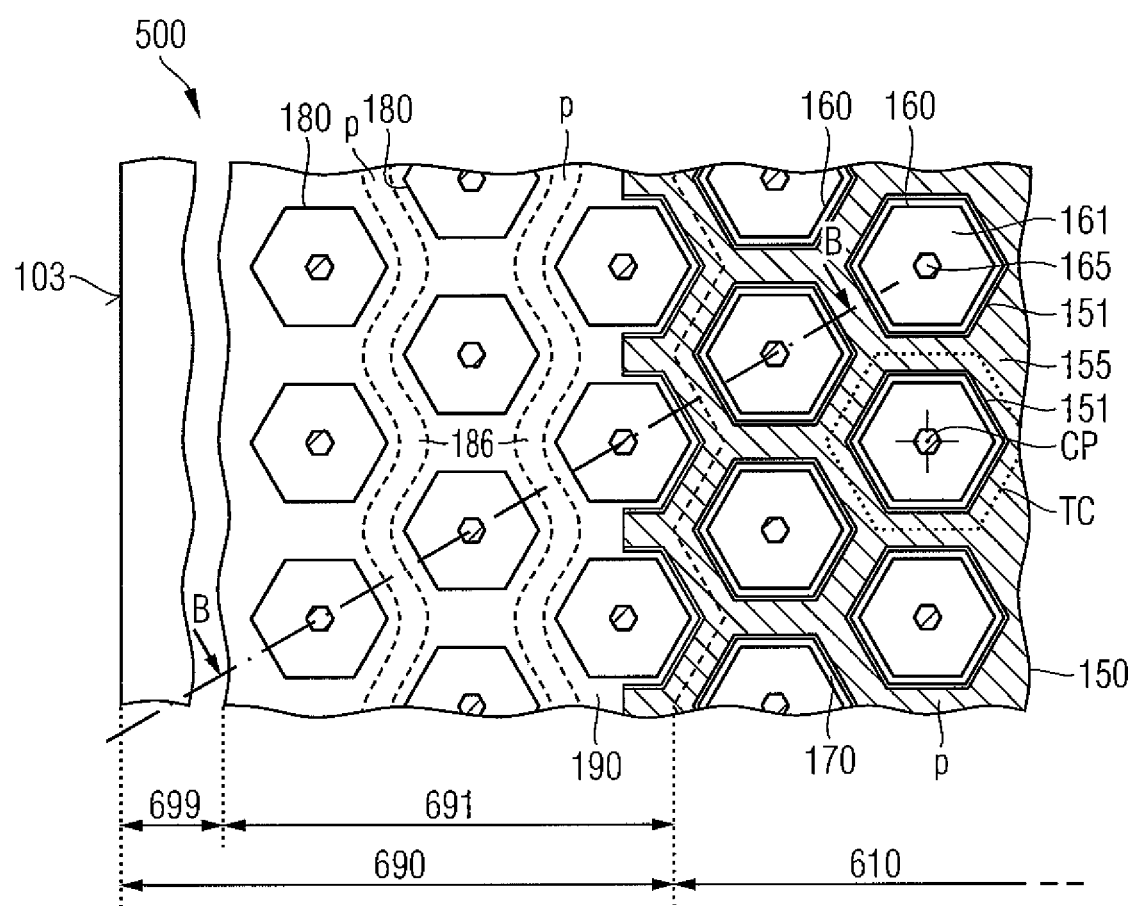
FIG. 4A is a schematic horizontal cross-sectional view of a portion of a semiconductor device according to an embodiment concerning stripe-shaped near-surface doped regions electrically connected with termination electrodes.
Figure 4B:
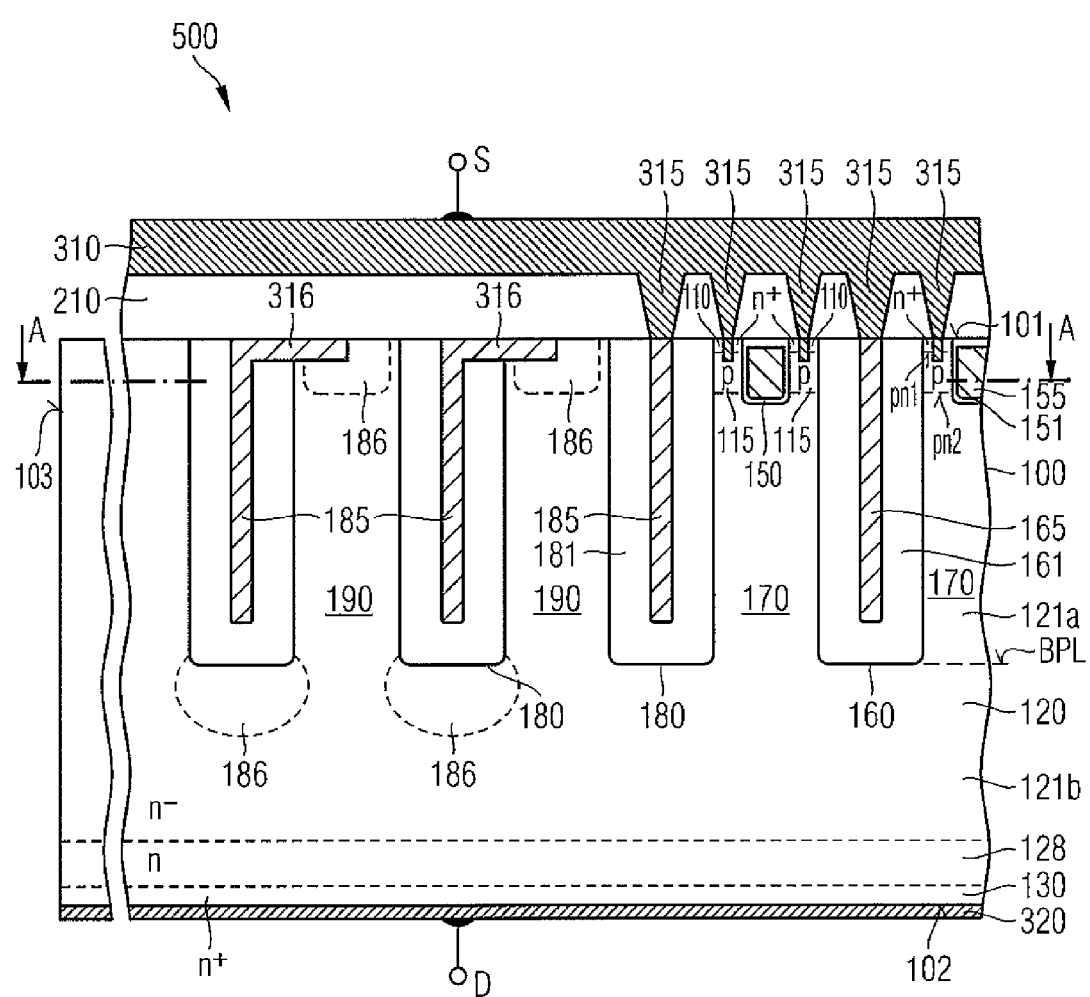
FIG. 4B is a schematic vertical cross-sectional view of the semiconductor device portion of FIG. 4A along line B-B.

Alternatively or in addition to dot-shaped near-surface doped regions 186 as illustrated in FIGS. 3A to 3B the semiconductor device 500 of FIGS. 4A to 4B includes stripe-shaped near-surface doped regions 186 meandering between neighboring rings of termination structures 180. Auxiliary contact structures 316, which may be formed from heavily doped polycrystalline silicon may extend from the first surface into the termination structures 180 and the semiconductor body 100 and electrically connect the near-surface doped regions 186 to neighboring termination electrodes 185.

FIGS. 5A to 5E are related to further embodiments of the doped regions 186 that may be combined with any of the layouts depicted in FIGS. 2A to 2F, by way of example.

Figure 5A:
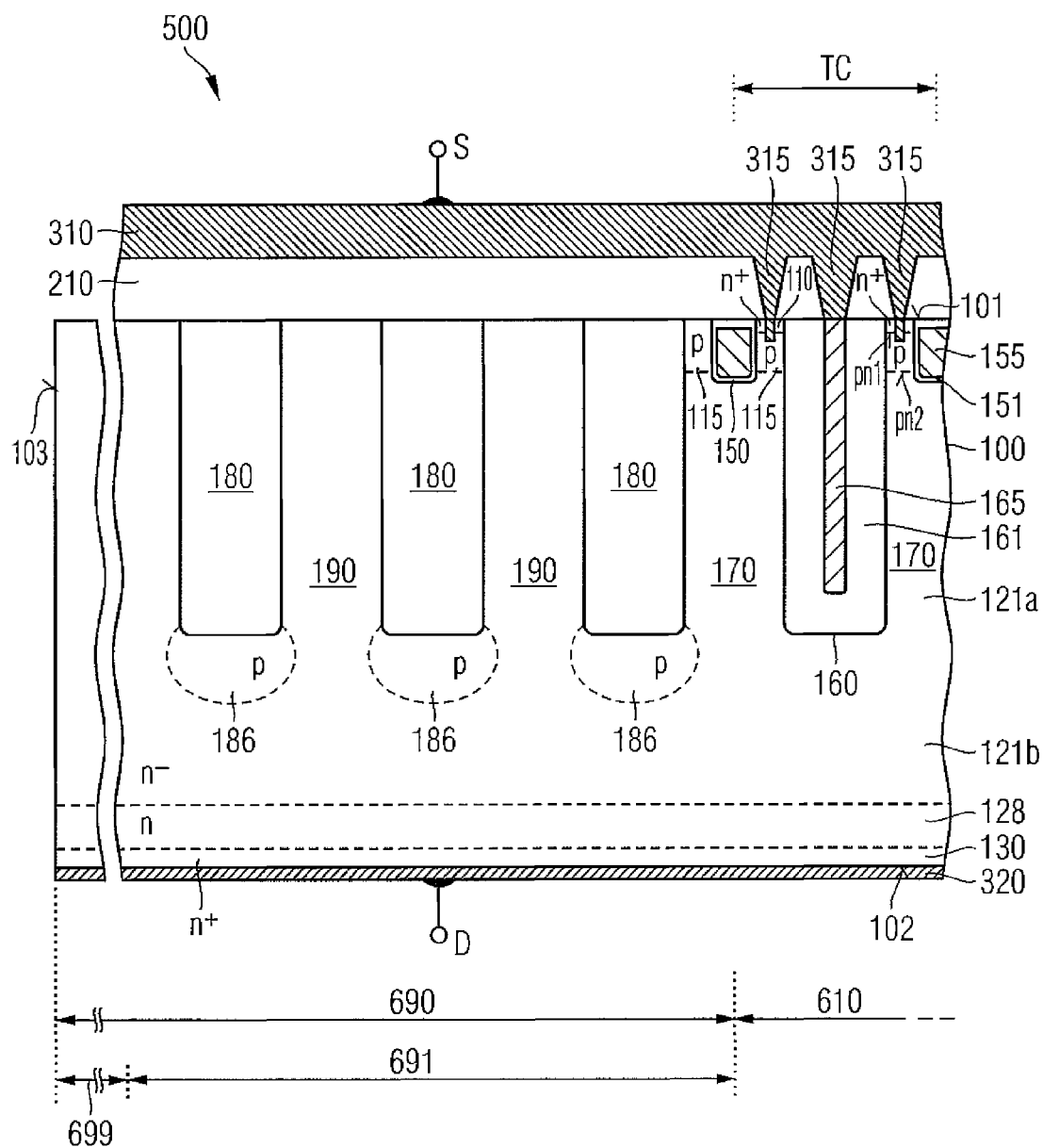
FIG. 5A is a schematic vertical cross-sectional view of a portion of a semiconductor device according to an embodiment with buried doped regions adjoining bottom portions of termination structures consisting of insulating materials and/or intrinsic semiconductor material.

FIG. 5A illustrates termination structures 180 completely formed from insulating material and/or intrinsic semiconducting material. Buried doped regions 186 are formed in the vertical projection of the termination structures 180 between the termination structures 180 and the second surface 102. The buried doped regions 186 may directly adjoin the termination structures 180 or may be spaced from the termination structures 180, form pn junctions with the drift zone 121, and may be fully depleted in an operational mode of the semiconductor device 500 within the maximum ratings of the semiconductor device 500. In the illustrated embodiment, a vertical extension of all termination structures 180 perpendicular to the first surface 101 is greater than a vertical extension of the field electrode structures 160. According to other embodiments, the vertical extension of at least one circumferential termination structure 180 is greater than the vertical extension of the field electrode structures 160.

For further details, reference is made to the description of FIGS. 1A to 1B and FIGS. 3A to 3B.

Figure 5B:
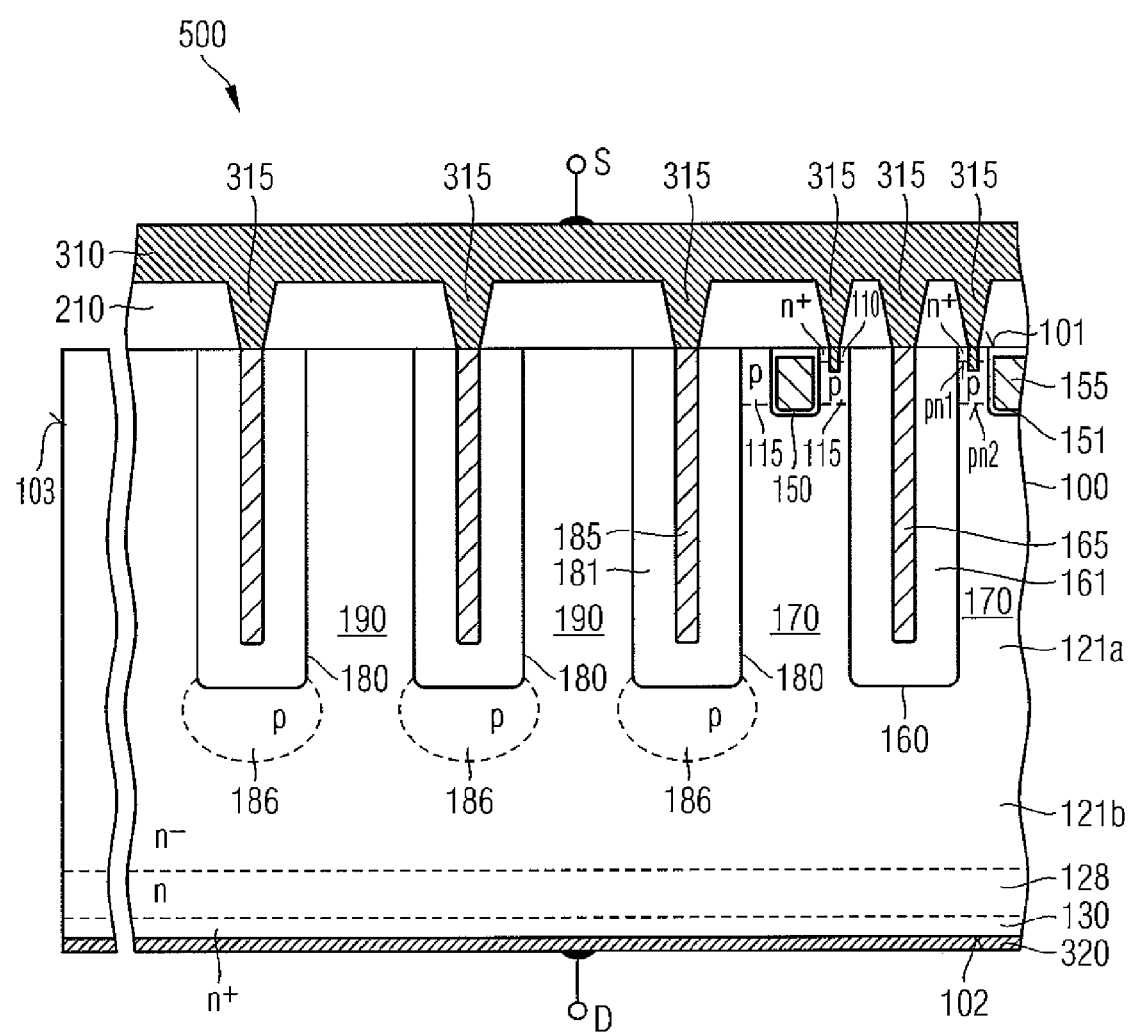
FIG. 5B is a schematic vertical cross-sectional view of a portion of a semiconductor device according to an embodiment with buried doped regions and termination electrodes electrically connected to a source potential.

In FIG. 5B, the termination structures 180 include conductive termination electrodes 185 and field dielectrics 181 insulating the termination electrodes 185 against the semiconductor body 100. In the illustrated embodiment contact structures 315 electrically connect the first load electrode 310 with all termination electrodes 185. According to other embodiments, only some of the termination electrodes 185 are electrically connected to the first load electrode 310. Other embodiments may electrically connect some or all of the termination electrodes 185 to a gate potential applied to the gate electrodes 155, to an additional control terminal or to an output of an internal driver circuit. According to further embodiments, some or all of the termination electrodes 185 may float. The termination electrodes 185 may be electrically connected to different potentials.

In FIG. 5C the termination electrodes 185 electrically float and are electrically connected to buried doped regions 186 formed in the vertical projection of the termination structures 180 between the bottom plane BPL and the second surface 102. The buried doped regions 186 form pn junctions with the drift zone 121, extend into the contiguous portions CS, and are spaced from the field stop layer 128. The doped regions 186 may be formed by outdiffusion of dopants from termination electrodes 185 based on heavily doped polycrystalline silicon.

The semiconductor device 500 of FIG. 5D combines electrically floating and depletable buried doped regions 186 formed in the vertical projection of the termination structures 180 with near-surface doped regions 186 electrically connected to neighboring termination electrodes 185 as illustrated in FIGS. 3A-3B and 4A-4B.

Figure 5E:
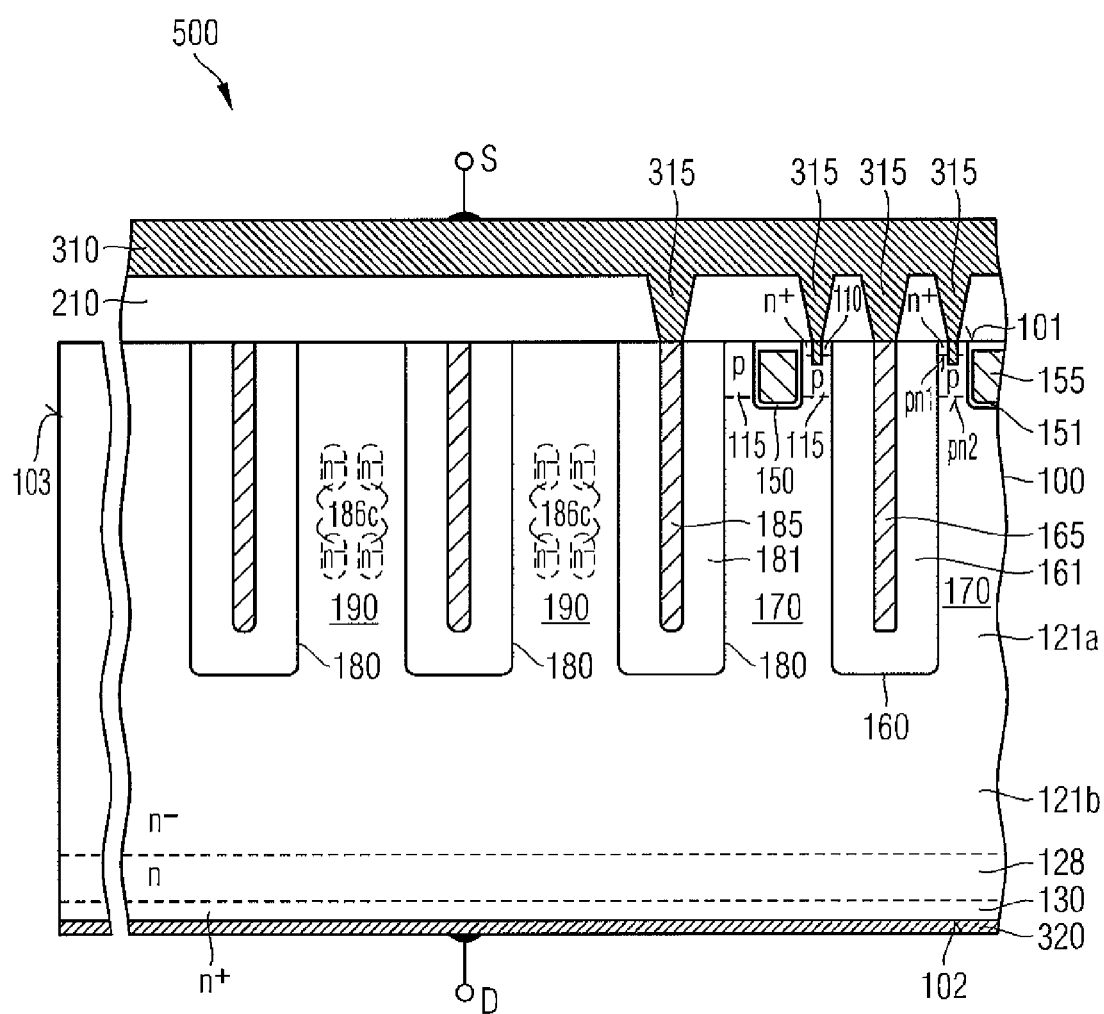
FIG. 5E is a schematic vertical cross-sectional view of a portion of a semiconductor device according to an embodiment with buried low-doped regions between termination structures.
Figure 5F:
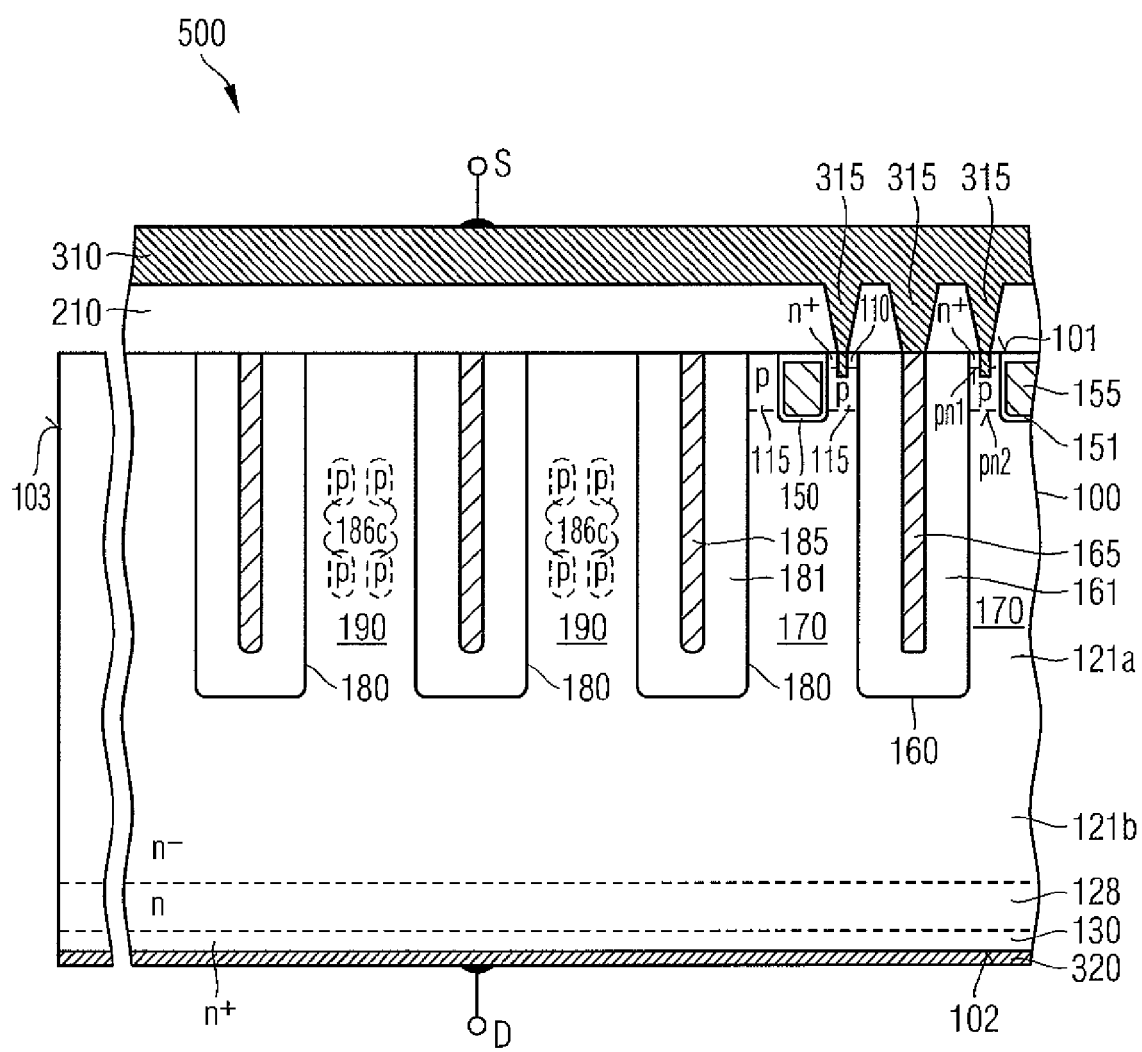
FIG. 5F is a schematic vertical cross-sectional view of a portion of a semiconductor device according to an embodiment with buried counter-doped regions between termination structures.

FIGS. 5E and 5F concern semiconductor devices 500 with doped regions 186 formed between neighboring termination structures 180, respectively. One, two or more doped regions 186 may be formed in the respective termination mesa 190, wherein the doped regions 186 may directly adjoin the neighboring termination structures 180 or may be spaced from the neighboring termination structures 180.

In FIG. 5E, the doped regions 186 have the same conductivity type as the drift zone 121 and form unipolar homojunctions with the drift zone 121. A minimum net dopant concentration in the doped regions 186 may be at most a half of the mean dopant concentration in the first portions 121a of the drift zone 121. Boron may be introduced into the doped regions to counterdope the drift zone 121.

Figure 5G:
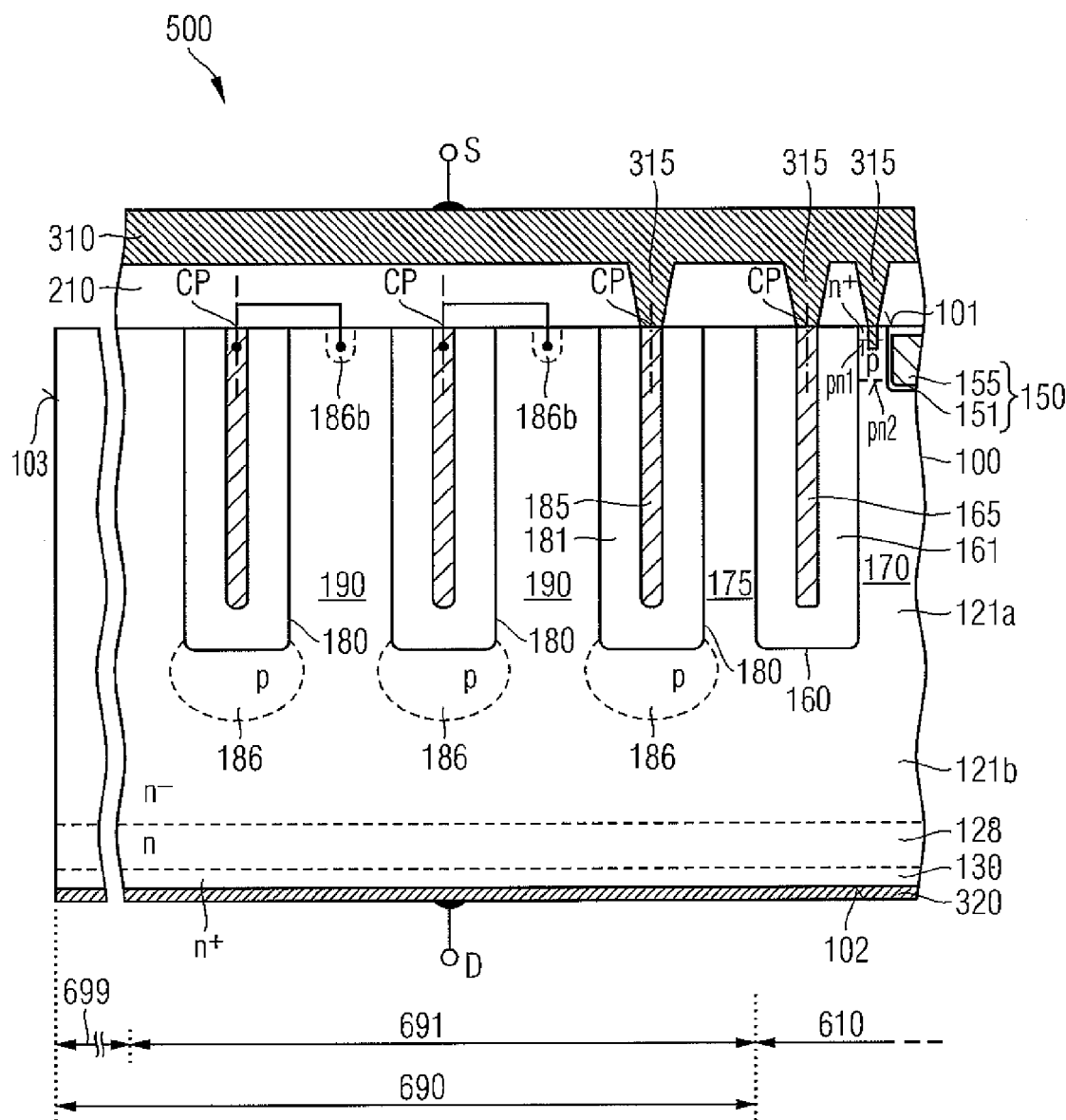
FIG. 5G is a schematic vertical cross-sectional view of a portion of a semiconductor device according to an embodiment with a narrow auxiliary mesa between field electrode structures and termination structures.

In FIG. 5F the conductivity type of the doped regions 186 is opposite to that of the drift zone 121 and the doped regions 186 form pn junctions with the drift zone 121. The maximum net dopant concentration in the counter-doped region 186 is in a range between $1E15$ cm$^{-3}$ and $1E18$ cm$^{-3}$ In the semiconductor device 500 illustrated in FIG. 5G field electrode structures 160 are regularly arranged in lines in a cell area 610. Center points CP of the field electrode structures 160 form a first regular pattern. Termination structures 180 are formed in an inner edge area 691 surrounding the cell area 610. Center points CP of the termination structures 180 form a second regular pattern congruent with a portion of the first regular pattern, wherein center-to-center distances between the termination structures 180 are equal to center-to-center distances between the field electrode structures 160.

Cell mesas 170 separate neighboring ones of the field electrode structures 160 from each other in the cell area 610 and include first portions 121a of a drift zone 121. Gate structures 150 including a gate electrode 155 may extend from the first surface 101 into the semiconductor body 100. A voltage applied to the gate electrode 155 controls a current flow through the cell mesas 170. In the inner edge area 691 between the cell area 610 and an outermost termination structure 180, doped regions 186 forming pn junctions with the drift zone 121 directly adjoin the termination structures 180 in a vertical projection of the respective termination structure 180.

An auxiliary mesa 175 between the outermost field electrode structures 160 of the first pattern and the innermost termination structures 180 of the second pattern is narrower than the cell mesas 170 to improve the voltage blocking capability.

Figure 6A:
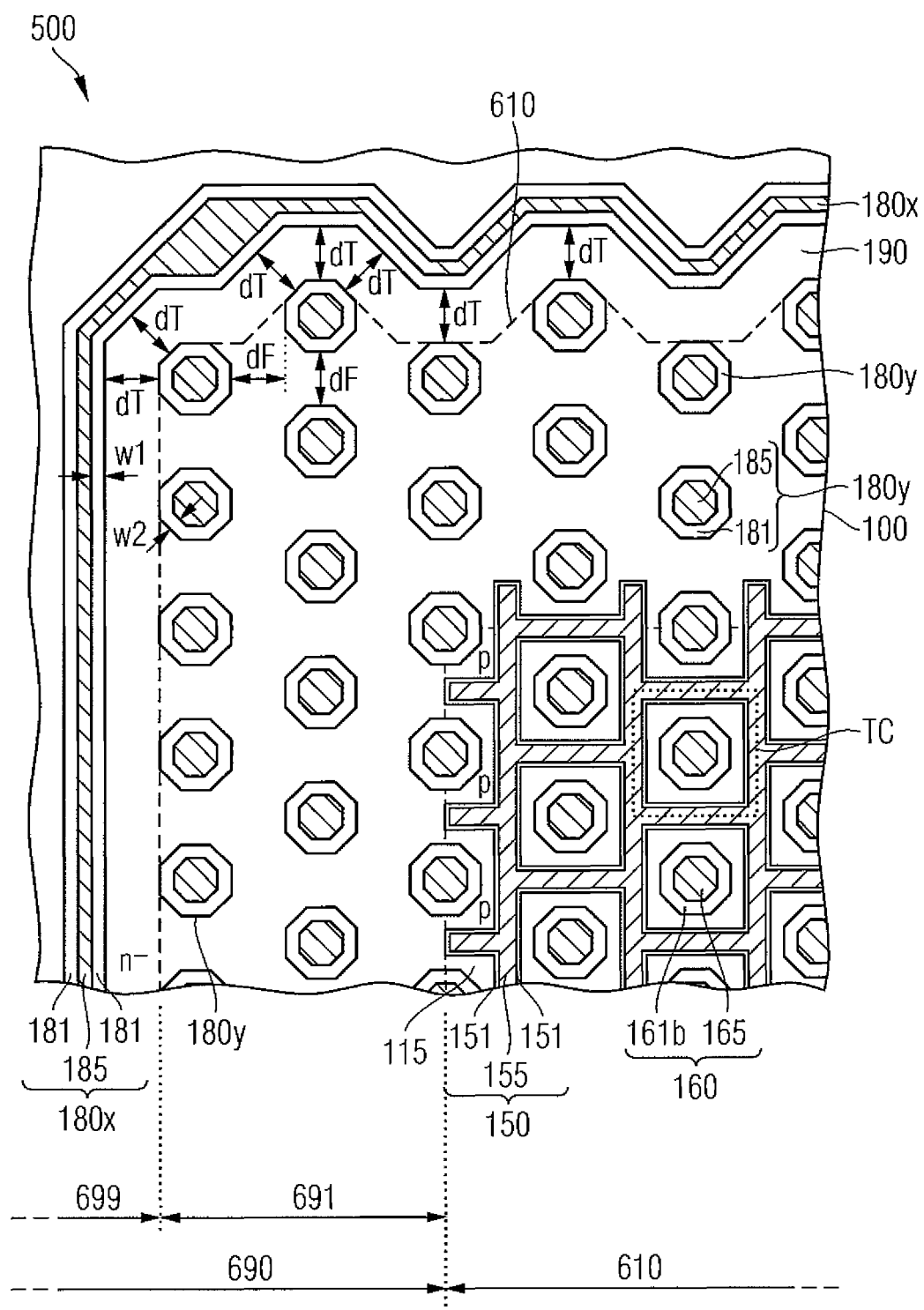
FIG. 6A is a schematic horizontal cross-sectional view of a portion of a semiconductor device in accordance with an embodiment related to needle-shaped, octagonal field electrode structures arranged in shifted lines and to a circumferential termination structure of approximately constant width.
Figure 6B:
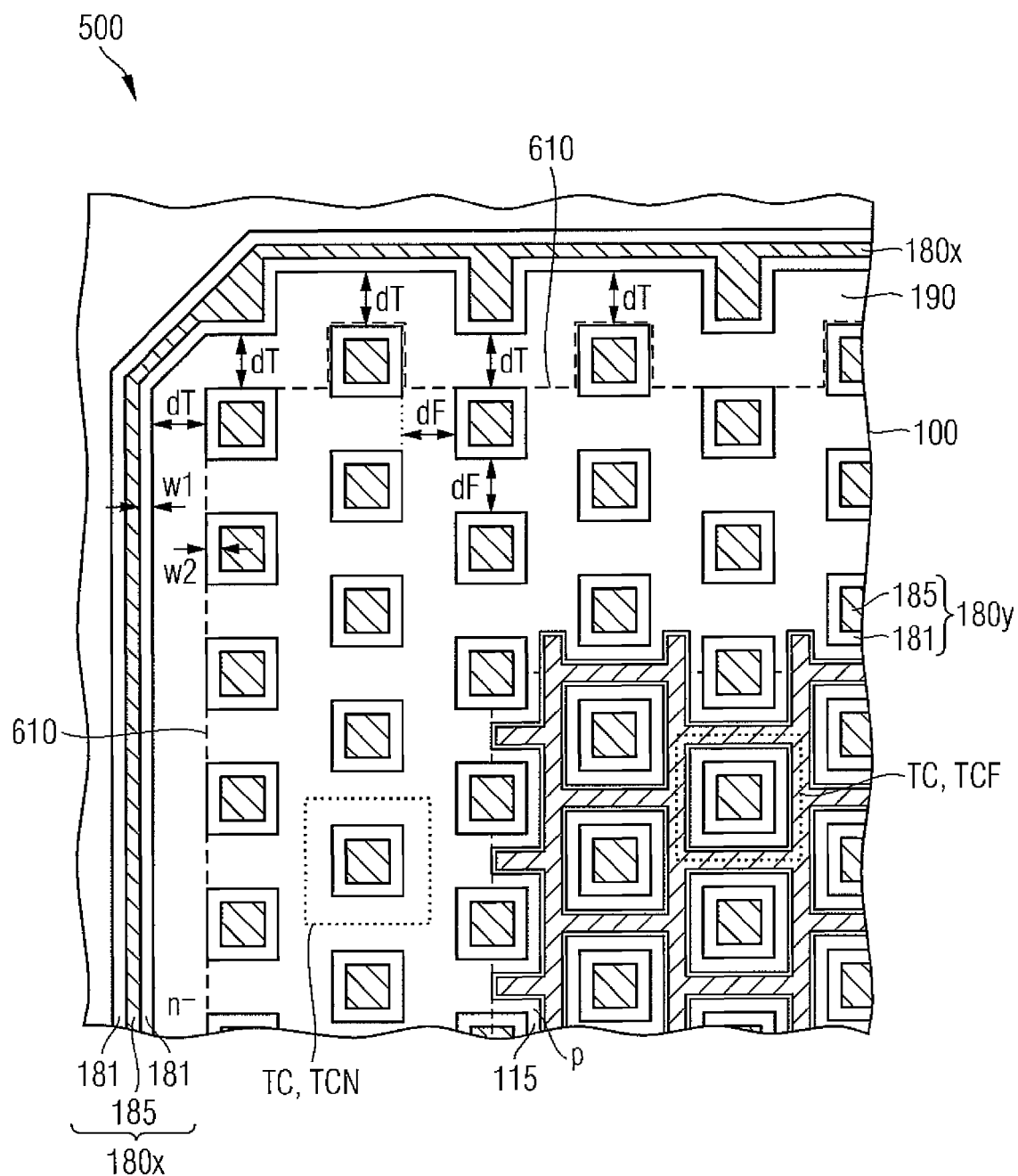
FIG. 6B is a schematic horizontal cross-sectional view of a portion of a semiconductor device in accordance with an embodiment related to needle-shaped, square field electrode structures arranged in shifted lines and to a circumferential termination structure with rectangular bulges.

FIGS. 6A and 6B refer to layouts with the transistor cells TC and field electrode structures 160 arranged in shifted lines, wherein the odd lines are shifted to the even lines by one half of the distance between two neighboring transistor cells TC or two neighboring field electrode structures 160.

According to the embodiment of FIG. 6A the inner contour of a first termination structure 180x follows the contour line of a cell area 610 including needle-shaped field electrode structures 160 with octagonal horizontal cross-sections. A width of the termination structure 180 may vary or may be approximately uniform. As a result, the termination mesa 190 has long straight sections extending parallel to the lines of field electrode structures 160 and zigzag sections oriented orthogonal to the long straight sections 180y. The edge area 690 further includes three rings of needle-shaped second termination structures 180y.

FIG. 6B refers to an embodiment with approximately square field electrode structures 160 and a circumferential first termination structure 180x with rectangular bulges along the inner contour in the projection of the indented lines. The inner contour of the frame-like termination structure 180 follows a contour of the cell area 610 approximated by orthogonal lines. According to further embodiments, transitions between orthogonal portions of the termination structure 180 or transitions to slanted, non-orthogonal sections may be rounded.

Figure 7:
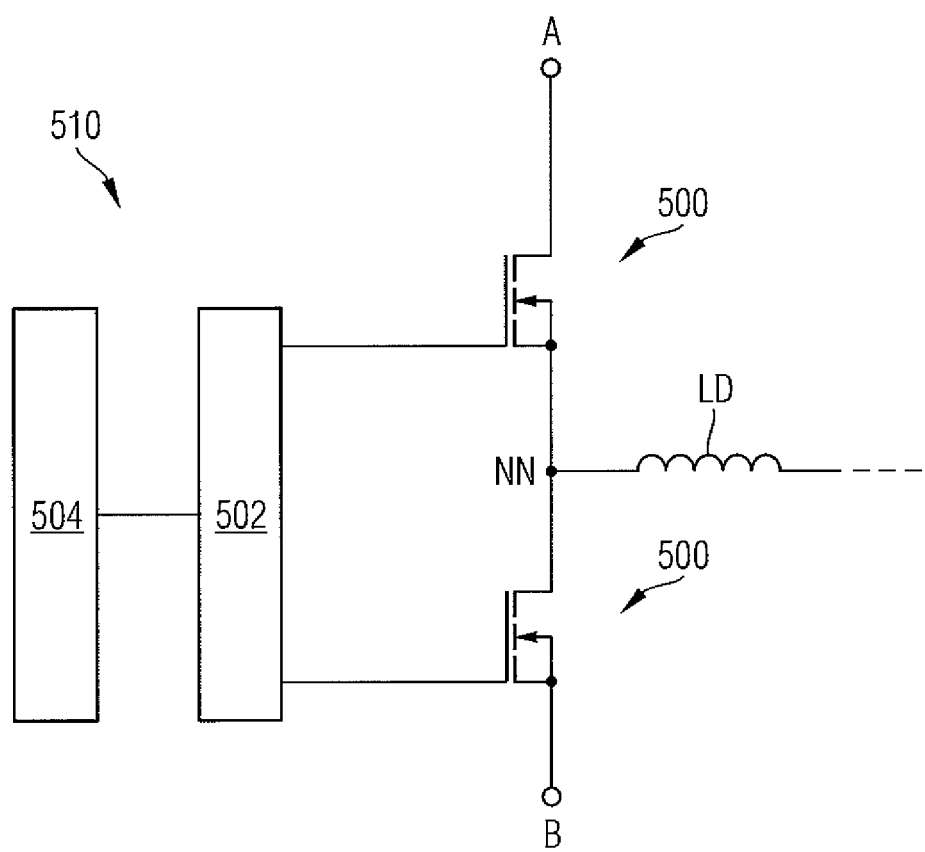
FIG. 7 is a simplified circuit diagram of an electronic circuit according to a further embodiment.

FIG. 7 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two identical or different semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. A network node NN between the two semiconductor devices 500 may be electrically connected to an inductive load, which may be a winding of a transformer or a motor winding, or to a reference potential of an electronic circuit, by way of example. The electronic assembly 510 may further include a control circuit 504 that supplies a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, the network node NN electrically connected to a motor winding and the supply terminals A, B supplying a DC voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device comprising:
field electrode structures arranged in a cell area and between gate structures, wherein the field electrode structures extend into a semiconductor body and form a first portion of a pattern;
termination structures formed in an inner edge area surrounding the cell area, wherein at least portions of the termination structures form a second portion of the pattern;
cell mesas separating neighboring ones of the field electrode structures from each other in the cell area; and
at least one doped region forming a homojunction with a drift zone in the inner edge area,
wherein each of the field electrode structures comprises a field electrode and a field dielectric separating the field electrode from the semiconductor body,
wherein each of the termination structures comprises a termination electrode and a termination dielectric separating the termination electrode from the semiconductor body.

2. The semiconductor device of claim 1, wherein the at least one of said termination structures comprises first portions and second portions, the first portions and the field electrode structures arranged in lines and forming the pattern and each second portion connecting two of the first portions.

3. The semiconductor device of claim 1, wherein at least one of the termination structures surrounds the cell area.

4. The semiconductor device of claim 1, wherein a width of a termination mesa between a circumferential termination structure surrounding the cell area and neighboring termination structures or field electrode structures is uniform along a circumference.

5. The semiconductor device of claim 1, wherein the termination and field electrode structures are arranged in lines and form the pattern.

6. The semiconductor device of claim 1, wherein the at least one doped region is arranged between termination structures and is configured to float.

7. The semiconductor device of claim 1, wherein the at least one doped region forms a pn junction with the drift zone.

8. The semiconductor device of claim 1, wherein the at least one doped region is depletable in an operational mode of the semiconductor device.

9. The semiconductor device of claim 1, wherein the at least one doped region forms a unipolar homojunction with the drift zone and a mean net dopant concentration in the drift zone is at least twice as high as a mean net dopant concentration in the at least one doped region.

10. The semiconductor device of claim 1, wherein the termination structures extend from a first surface into the semiconductor body and wherein the at least one doped region is arranged as a vertical projection of the termination structures and forms a pn junction with the drift zone.

11. The semiconductor device of claim 10, wherein the at least one doped region is depletable in an operational mode of the semiconductor device.

12. The semiconductor device of claim 1, wherein each of said termination structures comprises insulating material and/or intrinsic semiconducting materials.

13. The semiconductor device of claim 1, wherein the at least one doped region directly adjoins a respective termination electrode.

14. The semiconductor device of claim 1, wherein the at least one doped region is formed between the termination structures, forms a pn junction with the drift zone and is electrically connected to a termination electrode of the termination structures, wherein the at least one doped region is closer to the cell area than the termination electrode.

15. The semiconductor device of claim 1, wherein the field electrode and termination structures have a same width.

16. The semiconductor device of claim 1, wherein a vertical extension of the termination structures is greater than a vertical extension of the field electrode structures.

17. The semiconductor device of claim 1, wherein a width of a circumferential termination structure is smaller than a lateral extension of the field electrode structures.

* * * * *